United States Patent
Lee

(10) Patent No.: US 11,171,191 B2
(45) Date of Patent: Nov. 9, 2021

(54) DISPLAY APPARATUS HAVING A LIGHT-EMITTING DEVICE ON AN OVER-COAT LAYER, AND METHOD OF FORMING THE SAME

(71) Applicant: LG Display Co., Ltd., Seoul (KR)

(72) Inventor: Dong-Ho Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 120 days.

(21) Appl. No.: 16/574,510

(22) Filed: Sep. 18, 2019

(65) Prior Publication Data

US 2020/0091260 A1     Mar. 19, 2020

(30) Foreign Application Priority Data

Sep. 18, 2018 (KR) .......................... 10-2018-0111585

(51) Int. Cl.
| | |
|---|---|
| *H01L 27/14* | (2006.01) |
| *H01L 27/32* | (2006.01) |
| *H01L 51/52* | (2006.01) |

(52) U.S. Cl.
CPC ........ *H01L 27/3258* (2013.01); *H01L 27/322* (2013.01); *H01L 27/3246* (2013.01); *H01L 27/3248* (2013.01); *H01L 51/5253* (2013.01); *H01L 2227/323* (2013.01)

(58) Field of Classification Search
CPC ............... H01L 27/322; H01L 27/3246; H01L 27/3248; H01L 27/3251; H01L 27/3258; H01L 27/3283; H01L 51/5253
USPC .......................................................... 257/72
See application file for complete search history.

(56) References Cited

U.S. PATENT DOCUMENTS

| | | | | |
|---|---|---|---|---|
| 2009/0315458 A1* | 12/2009 | Choi | ............... | H01L 51/5212 313/505 |
| 2017/0345880 A1* | 11/2017 | Kim | ............... | H01L 51/5246 |
| 2018/0151831 A1* | 5/2018 | Lee | ............... | H01L 27/3223 |

* cited by examiner

*Primary Examiner* — Brook Kebede
(74) *Attorney, Agent, or Firm* — Morgan, Lewis & Bockius LLP

(57) ABSTRACT

A display apparatus having a light-emitting device and a method of forming the same are provided. The light-emitting device may include a lower electrode, a light-emitting layer and an upper electrode, which are sequentially stacked on an over-coat layer. The over-coat layer may include a step compensation groove. An end portion of the lower electrode may be disposed in the step compensation groove. A bank insulating layer covering the end portion of the lower electrode may be disposed in the step compensation groove of the over-coat layer. An upper surface of the bank insulating layer opposite to the over-coat layer may be a flat surface. Thus, in the display apparatus and the method, peeling and/or damage of the upper electrode due to external force may be prevented.

20 Claims, 20 Drawing Sheets

DISPLAY APPARATUS HAVING A LIGHT-EMITTING DEVICE ON AN OVER-COAT LAYER, AND METHOD OF FORMING THE SAME

This application claims the priority benefit of Korean Patent Application No. 10-2018-0111585, filed on Sep. 18, 2018, which is hereby incorporated by reference as if fully set forth herein.

BACKGROUND

Technical Field

The present disclosure relates to a display apparatus in which a light-emitting device including a lower electrode, a light-emitting layer and an upper electrode, which are sequentially stacked, is disposed on an over-coat layer, and a method of forming the same.

Discussion of the Related Art

Generally, an electronic appliance, such as a monitor, a TV, a laptop computer and a digital camera, includes a display apparatus to realize an image. For example, the display apparatus may include a liquid crystal display apparatus and an organic light-emitting display apparatus.

The display apparatus may include a plurality of light-emitting device on a device substrate. The light-emitting device may emit light displaying a specific color in order to generate the image which is provided to user. For example, the light-emitting device may include a lower electrode, a light-emitting layer and an upper electrode, which are sequentially stacked.

The light-emitting devices may be driven independently. For example, the lower electrode of each light-emitting device may be insulated with the lower electrode of adjacent light-emitting device by a bank insulating layer. The bank insulating layer may cover an edge of the lower electrode. The light-emitting layer and the upper electrode may extend onto the bank insulating layer.

However, since the upper electrode including a conductive material has a relatively low adhesive strength, the upper electrode of the display apparatus may be peeled from the light-emitting layer due to the height deviation of the upper electrode caused by the bank insulating layer. Also, in the display apparatus, when bending or a warpage occurs due to external force, the upper electrode may peel and/or be damaged due to the height deviation of the upper electrode.

SUMMARY

Accordingly, embodiments of the present disclosure are directed to a display apparatus and a method of forming the same that substantially obviates one or more problems due to limitations and disadvantages of the related art.

An aspect of the present disclosure is to provide a display apparatus capable of preventing peeling and/or damage of the upper electrode due to the bank insulating layer, and a method of forming the same.

Another aspect of the present disclosure is to provide a display apparatus capable of minimizing the height deviation of the upper electrode due to the bank insulating layer, and a method of forming the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, as embodied and broadly described herein, a display apparatus comprises an over-coat layer on a device substrate. The over-coat layer includes a step compensation groove. A first lower electrode is disposed on the over-coat layer. An end portion of the first lower electrode is disposed in the step compensation groove of the over-coat layer. The end portion of the first lower electrode is covered by a bank insulating layer in the step compensation groove of the over-coat layer. A light-emitting layer is disposed on a portion of the first lower electrode exposed by the bank insulating layer. An upper surface of the bank insulating layer toward the light-emitting layer is a flat surface. An upper electrode is disposed on the light-emitting layer.

The upper surface of the bank insulating layer may be coplanar with an upper surface of the first lower electrode toward the light-emitting layer.

The step compensation groove of the over-coat layer may extend along an edge of the first lower electrode.

A thin film transistor may be disposed between the device substrate and the over-coat layer. The over-coat layer may include a drain contact hole partially exposing a drain electrode of the thin film transistor. The drain contact hole may be disposed at the inside of the step compensation groove.

A second lower electrode may be disposed on the over-coat layer. The second lower electrode may be spaced away from the first lower electrode. The bank insulating layer may include a bank separating hole between the first lower electrode and the second lower electrode.

The upper electrode may extend onto a sidewall of the bank separating hole.

The over-coat layer may include an over-coat separating hole overlapping with the bank separating hole.

The bank insulating layer may have a water vapor transmission rate lower than the over-coat layer. A sidewall of the over-coat separating hole may be covered by the bank insulating layer.

In another aspect, the display apparatus comprises a first over-coat layer on a device substrate. The first over-coat layer includes a first region and a second region. The second region is disposed at the outside of the first region. A second over-coat layer is disposed on the first region of the first over-coat layer. A light-emitting layer is disposed on the second over-coat layer. A lower surface of the light-emitting layer toward the device substrate is a flat surface. The light-emitting layer extends onto the second region of the first over-coat layer. A bank insulating layer is disposed between the second region of the first over-coat layer and the light-emitting layer. A lower electrode is disposed between the second over-coat layer and the light-emitting layer. The lower electrode extends between the first over-coat layer and the bank insulating layer. An upper electrode on the light-emitting layer.

The vertical distance between the second region of the first over-coat layer and the light-emitting layer may be the same as a sum of the thickness of the second over-coat layer and the thickness of the lower electrode.

A color filter may be disposed between the device substrate and the first over-coat layer. The color filter may overlap with the second over-coat layer.

The horizontal width of the color filter may be larger than the horizontal width of the second over-coat layer.

The second over-coat layer may include a material different from the first over-coat layer.

An encapsulating layer may be disposed on the upper electrode. An encapsulation substrate may be disposed on the encapsulating layer. The thermal conductivity of the encapsulation substrate may be higher than the thermal conductivity of the device substrate.

In another aspect, a method of forming a display apparatus comprises a step of forming an over-coat layer including a step compensation groove on a device substrate, a step of forming a lower electrode extending along a sidewall of the step compensation groove on the over-coat layer, a step of forming an insulating material layer on an entire surface of the device substrate in which the lower electrode is formed, a step of forming a bank insulating layer covering an end portion of the lower electrode in the step compensation groove by selectively etching the insulating material layer, a step of forming a light-emitting layer on a portion of the lower electrode exposed by the bank insulating layer, and a step of forming an upper electrode on the light-emitting layer. The step of forming the bank insulating layer includes a step of planarizing an upper surface of the bank insulating layer opposite to the device substrate.

The step of planarizing the upper surface of the bank insulating layer may include a step of forming the upper surface of the bank insulating layer to be coplanar with an upper surface of the lower electrode opposite to the device substrate.

The step of forming the bank insulating layer may include a step of locating a mask on the insulating material layer, and a step of exposing the insulating material layer using the mask. The mask may include a blocking region, a transmitting region and a multi-tone region between the blocking region and the transmitting region. The multi-tone region of the mask may overlap with an inclined surface of the insulating material layer. The transmittance of the multi-tone region may change sequentially from the blocking region toward the transmitting region.

The blocking region may overlap with a bottom surface of the step compensation groove. The change in transmittance of the multi-tone region may be proportional to the inclination angle of the inclined surface of the insulating material layer.

A thin film transistor may be formed between the device substrate and the over-coat layer. The step of forming the over-coat layer may include a step of forming a drain contact hole partially exposing a drain electrode of the thin film transistor in the step compensation groove.

The drain contact hole may be formed simultaneously with the step compensation groove.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the invention and are incorporated in and constitute a part of this application, illustrate embodiments of the disclosure and together with the description serve to explain various principle. In the drawings.

DETAILED DESCRIPTION

Figure 1:
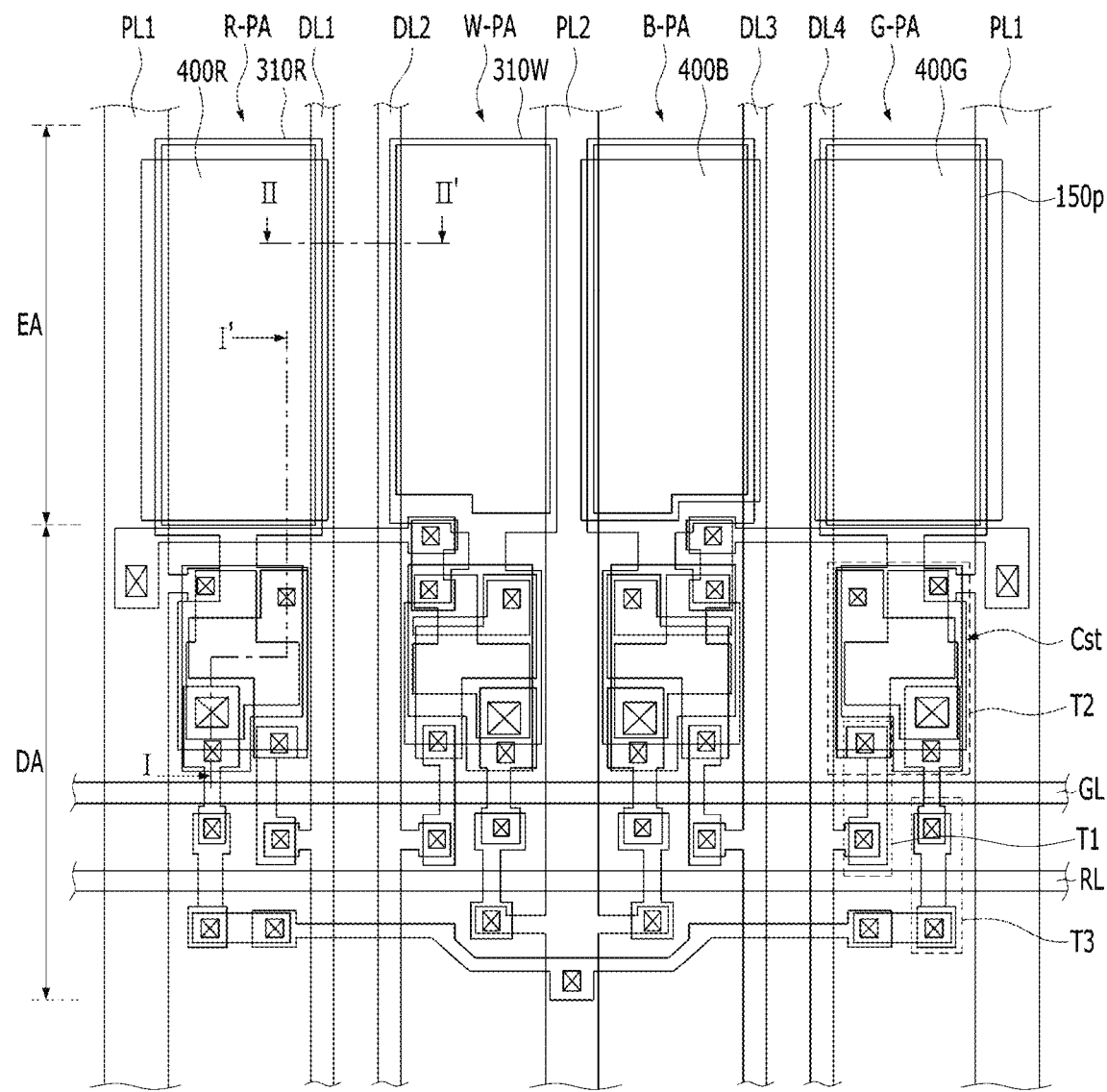
FIG. 1 is a view schematically showing a display apparatus according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical spirit of the present invention to be satisfactorily transferred to those skilled in the art, and thus the present invention may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical spirit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

FIG. 1 is a view schematically showing a display apparatus according to an embodiment of the present invention.

Figure 2A:
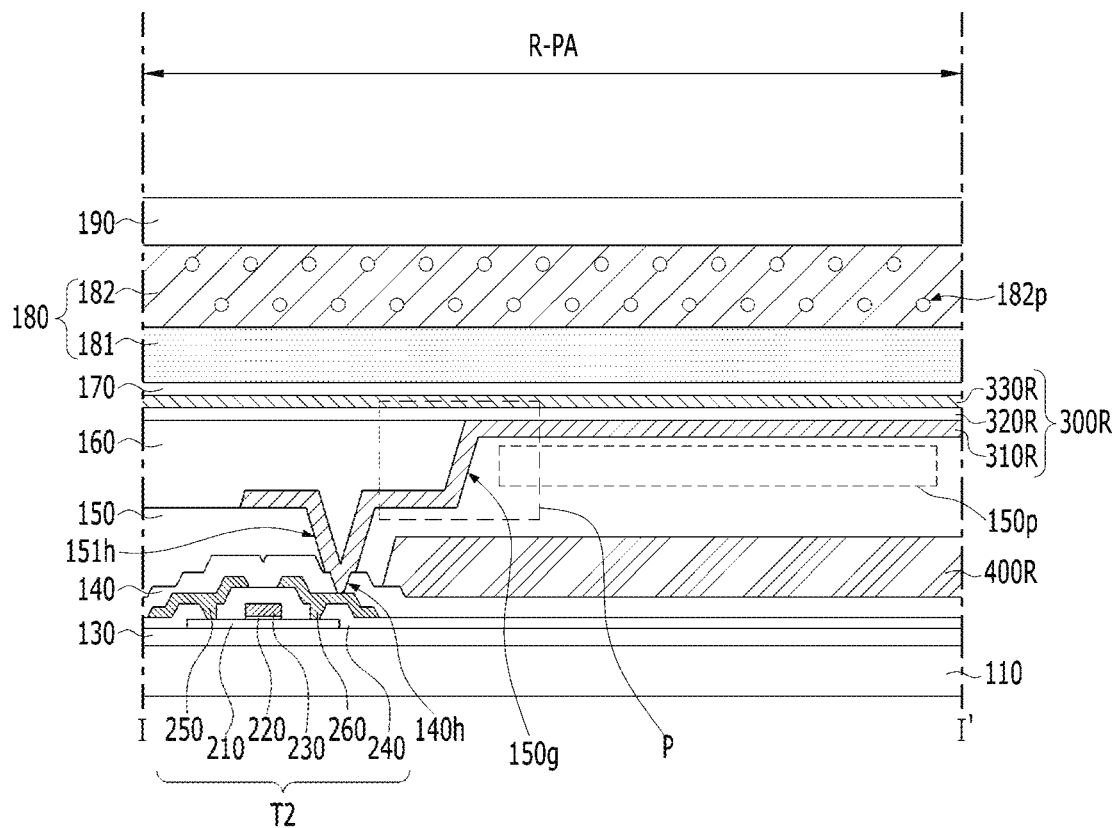
FIG. 2A is a view taken along I-I' of FIG. 1.
Figure 2B:
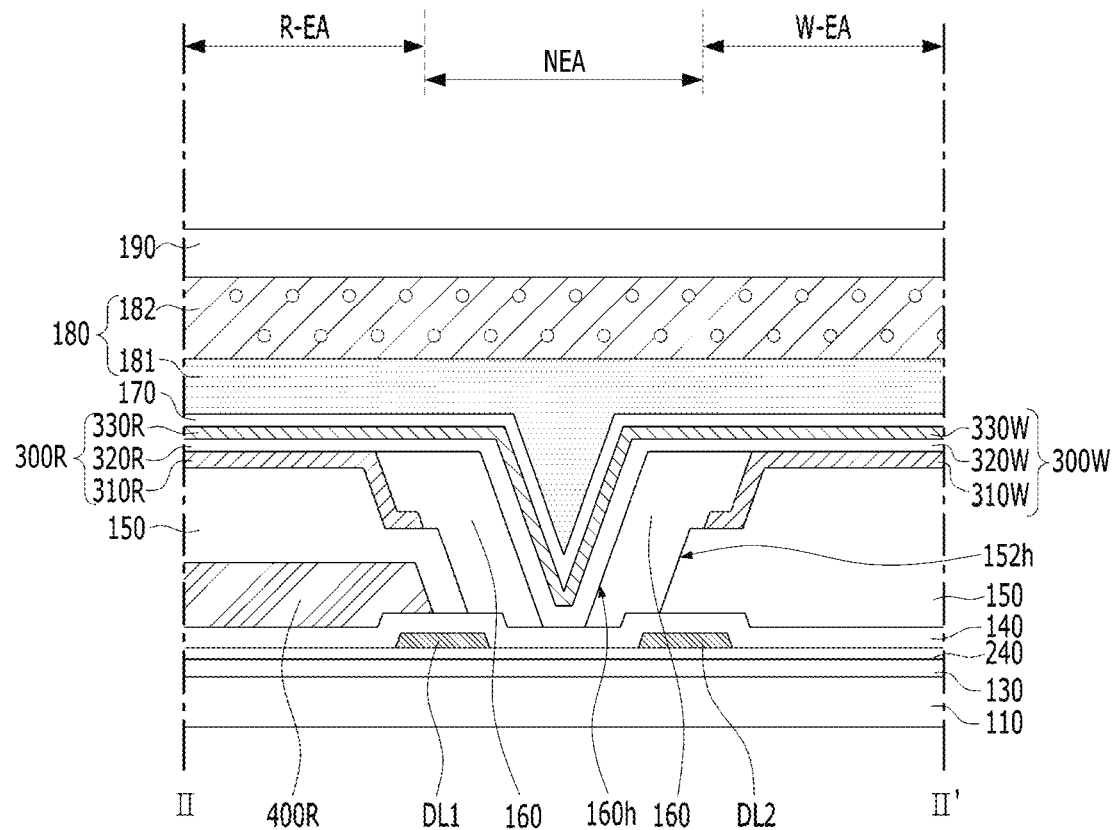
FIG. 2B is a view taken along II-II' of FIG. 1.
Figure 2C:
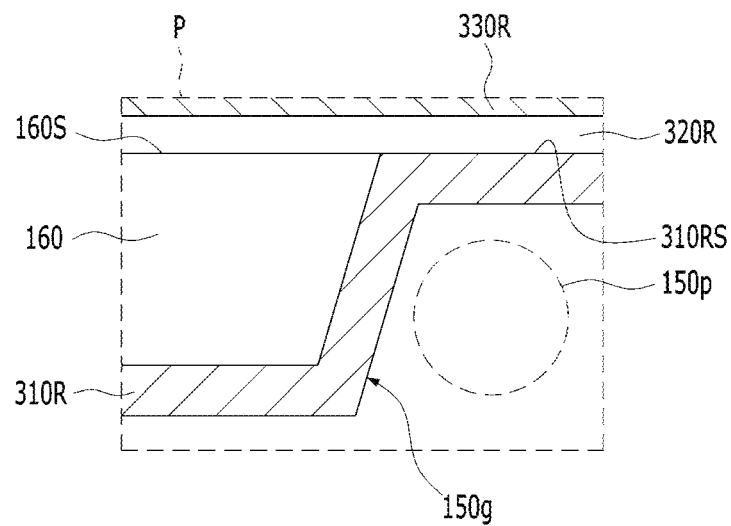
FIG. 2C is an enlarged view of P region in FIG. 2A.

FIG. 2A is a view taken along I-I' of FIG. 1. FIG. 2B is a view taken along II-II' of FIG. 1. FIG. 2C is an enlarged view of P region in FIG. 2A.

Referring to FIGS. 1 and 2A to 2C, the display apparatus according to the embodiment of the present invention may include a device substrate 110. The device substrate 110 may include an insulating material. The device substrate 110 may include a transparent material. For example, the device substrate 110 may include glass or plastic.

The device substrate 110 may include a plurality of pixel regions R-PA, W-PA, B-PA and G-PA. Each of the pixel regions R-PA, W-PA, B-PA and G-PA may realize a specific color. Each of the pixel regions R-PA, W-PA, B-PA and G-PA may realize a color different from adjacent pixel region R-PA, W-PA, B-PA and G-PA. For example, the device substrate 110 may include a red pixel region R-PA realizing red color, a white pixel region W-PA realizing white color, a blue pixel region B-PA realizing blue color, and a green pixel region G-PA realizing green color. The pixel region R-PA, W-PA, B-PA and G-PA realizing different colors may be disposed side by side in a direction.

Signal lines GL, DL1-DL4, PL1, PL2 and RL may be disposed on an upper surface of the device substrate 110. Each of the pixel regions R-PA, W-PA, B-PA and G-PA may emit light realizing a corresponding color according to signals applied by the single lines GL, DL1-DL4, PL1, PL2 and RL. For example, the signal lines GL, DL1-DL4, PL1, PL2 and RL may include a gate line GL applying a gate signal, a data line DL1-DL4 applying a data signal and a power supply line PL1 applying a power supply voltage. The pixel region R-PA, W-PA, B-PA and G-PA realizing different colors may be disposed side by side along the gate line GL. The data lines DL1-DL4 may intersect with the gate line GL. The power supply line PL1 may be parallel with the data lines DL1-DL4.

The signal lines GL, DL1-DL4, PL1, PL2 and RL may be disposed between the pixel regions R-PA, W-PA, B-PA and G-PA. For example, the device substrate 110 may include a non-display region NEA between the pixel regions R-PA, W-PA, B-PA and G-PA. The signal lines GL, DL1-DL4, PL1, PL2 and RL may be disposed on the non-display region NEA of the device substrate 110. Each of the pixel regions R-PA, W-PA, B-PA and G-PA may be defined by the signal lines GL, DL1-DL4, PL1, PL2 and RL. For example, the signal lines GL, DL1-DL4, PL1, PL2 and RL may surround each pixel region R-PA, W-PA, B-PA and G-PA.

Each of the pixel regions R-PA, W-PA, B-PA and G-PA may include an emission area EA and a driving area DA. The emission area EA and the driving area DA may be disposed side by side in a direction parallel with one of the signal lines GL, DL1-DL4, PL1, PL2 and RL. For example, the emission area EA and the driving area DA of each of the pixel regions R-PA, W-PA, B-PA and G-PA may be disposed side by side along the data lines DL1-DL4.

A driving circuit may be disposed at the inside of the driving area DA. The driving circuit may control the operation of the corresponding emission area EA. For example, the driving circuit may include a first thin film transistor T1, a second thin film transistor T2 and a storage capacitor Cst.

The first thin film transistor T1 and the second thin film transistor T2 may generate a driving current corresponding to signal applied by the signal lines GL, DL1-DL4, PL1, PL2 and RL. The first thin film transistor T1 may have the same structure as the second thin film transistor T2. For example, the second thin film transistor T2 may include a semiconductor pattern 210, a gate insulating layer 220, a gate electrode 230, an interlayer insulating layer 240, a source electrode 250 and a drain electrode 260.

The semiconductor pattern 210 may be disposed close to the device substrate 110. The semiconductor pattern 210 may include a semiconductor material. For example, the semiconductor pattern 210 may include amorphous silicon or poly-silicon. The semiconductor pattern 210 may be an oxide semiconductor. For example, the semiconductor pattern 210 may include IGZO.

The semiconductor pattern 210 may include a source region, a drain region and a channel region. The channel region may be disposed between the source region and the drain region. The channel region may have an electrical conductivity lower than the source region and the drain region. For example, impurity concentrations of the source region and the drain region may be higher than impurity concentration of the channel region.

The gate insulating layer 220 may be disposed on an upper surface of the semiconductor pattern 210 opposite to the device substrate 110. The gate insulating layer 220 may overlap the channel region of the semiconductor pattern 210. The size of the gate insulating layer 220 may be smaller than the size of the semiconductor pattern 210. For example, the source region and the drain region of the semiconductor pattern 210 may be exposed by the gate insulating layer 220.

The gate insulating layer 220 may include an insulating material. For example, the gate insulating layer 220 may include silicon oxide (SiO) or silicon nitride (SiN). The gate insulating layer 220 may include a high-K material. For example, the gate insulating layer 220 may include hafnium oxide (HfO) or titanium oxide (TiO).

The gate electrode 230 may be disposed on the gate insulating layer 220. The gate electrode 230 may overlap the channel region of the semiconductor pattern 210. For example, a side surface of the gate electrode 230 may contact with a side surface of the gate insulating layer 220. The gate electrode 230 may be insulated from the semiconductor pattern 210 by the gate insulating layer 220.

The gate electrode 230 may include a conductive material. For example, the gate electrode 230 may include a metal, such as aluminum (Al), chrome (Cr), copper (Cu), titanium (Ti), molybdenum (Mo) and tungsten (W).

The interlayer insulating layer 240 may be disposed on the semiconductor pattern 210 and the gate electrode 230. The interlayer insulating layer 240 may be extended beyond the semiconductor pattern 210. For example, a side surface of the semiconductor pattern 210 and the side surface of the gate insulating layer 220 may be covered by the interlayer insulating layer 240. The interlayer insulating layer 240 of the second thin film transistor T2 may be coupled to the interlayer insulating layer 240 of the first thin film transistor T1.

The interlayer insulating layer 240 may include an insulating material. For example, the interlayer insulating layer 240 may include silicon oxide (SiO) and/or silicon nitride (SiN). The interlayer insulating layer 240 may have a multi-layer structure.

The source electrode 250 may be disposed on the interlayer insulating layer 240. The source electrode 250 may be electrically connected to the source region of the semiconductor pattern 210. For example, the source electrode 250 may include a portion overlapping with the source region of the semiconductor pattern 210. The interlayer insulating layer 240 may include a contact hole partially exposing the source region of the semiconductor pattern 210.

The source electrode 250 may include a conductive material. For example, the source electrode 250 may include a metal, such as aluminum (Al), chrome (Cr), copper (Cu), titanium (Ti), molybdenum (Mo) and tungsten (W). The source electrode 250 may include a conductive material different from the gate electrode 230.

The drain electrode 260 may be disposed on the interlayer insulating layer 240. The drain electrode 260 may be spaced away from the source electrode 250. The drain electrode 260 may be electrically connected to the drain region of the semiconductor pattern 210. For example, the drain electrode 260 may include a portion overlapping with the drain region of the semiconductor pattern 210. The interlayer insulating layer 240 may include a contact hole partially exposing the drain region of the semiconductor pattern 210.

The drain electrode 260 may include a conductive material. For example, the drain electrode 260 may include a metal, such as aluminum (Al), chrome (Cr), copper (Cu), titanium (Ti), molybdenum (Mo) and tungsten (W). The drain electrode 260 may include a conductive material different from the gate electrode 230. The drain electrode 260 may include the same material as the source electrode 250.

The first thin film transistor T1 may be controlled by the gate signal. For example, the gate electrode 230 of the first thin film transistor T1 may be electrically connected to the gate line GL. The gate electrode 230 of the second thin film transistor T2 may be electrically connected to the first thin film transistor T1. For example, the first thin film transistor T1 may supply the data signal to the gate electrode 230 of the second thin film transistor T2 according to the gate signal. The second thin film transistor T2 may supply a driving current according to the data signal to the emission area EA. The storage capacitor Cst may maintain the operation of the second thin film transistor T2 during a single frame. For example, the storage capacitor Cst may be connected between the gate electrode 230 and the drain electrode 260 of the second thin film transistor T2.

The signal lines GL, DL1-DL4, PL1, PL2 and RL may further include a reset voltage supply line PL2 and a reset line RL. The reset voltage supply line PL2 may apply a reset voltage to each pixel region R-PA, W-PA, B-PA and G-PA. For example, the reset voltage supply line PL2 may be parallel with the power supply line PL1. The reset line RL may apply a reset signal. The driving circuit of each pixel region R-PA, W-PA, B-PA and G-PA may further include a third thin film transistor T3. The third thin film transistor T3 may be controlled by the reset signal. The third thin film transistor T3 may have the same structure as the first thin film transistor T1 and the second thin film transistor T2. For example, the gate electrode 230 of the third thin film transistor T3 may be electrically connected to the reset line RL. The reset line RL may be parallel with the gate line GL. The third thin film transistor T3 may initialize the storage capacitor according to the reset signal. For example, the third thin film transistor T3 may be connected between the reset voltage supply line PL2 and the storage capacitor Cst according to the reset signal.

A buffer layer 130 may be disposed between the device substrate 110 and the driving circuits. The buffer layer 130 may be formed entirely on the upper surface of the device substrate 110 toward the driving circuits. For example, the buffer layer 130 between the device substrate 110 and the first thin film transistor T1 may be coupled to the buffer layer 130 between the device substrate 110 and the second thin film transistor T2. The buffer layer 130 may include an insulating material. For example, the buffer layer 130 may include silicon oxide (SiO).

A lower passivation layer 140 may be disposed on the driving circuits. The lower passivation layer 140 may prevent the damage of the driving circuits due to the external impact and moisture. For example, the first thin film transistor T1, the second thin film transistor T2 and the storage capacitor Cst in each pixel region R-PA, W-PA, B-PA and G-PA may be covered by the lower passivation layer 140. The lower passivation layer 140 may extend along a surface of the driving circuits opposite to the device substrate 110. For example, the lower passivation layer 140 may include a portion being direct contact with the interlayer insulating layer 240. The lower passivation layer 140 may include an insulating material. For example, the lower passivation layer 140 may include silicon oxide (SiO) or silicon nitride (SiN).

An over-coat layer 150 may be disposed on the lower passivation layer 140. The over-coat layer 150 may include an insulating material. The over-coat layer 150 may include a material different from the lower passivation layer 140. The over-coat layer 150 may include a relatively high fluidity material. For example, the over-coat layer 150 may include an organic insulating material.

The over-coat layer 150 may include a step compensation groove 150g and protruding regions 150p. The protruding regions 150p may be disposed in the emission area EA of each pixel region R-PA, W-PA, B-PA and G-PA. The protruding regions 150p may be defined by the step compensation groove 150g. For example, the step compensation groove 150g may be surrounded by the protruding regions 150p. The driving circuit of each pixel region R-PA, W-PA, B-PA and G-PA may overlap the step compensation groove 150g of the over-coat layer 150.

The over-coat layer 150 may remove the height difference of the corresponding emission area EA due to the driving circuit of each pixel region R-PA, W-PA, B-PA and G-PA. For example, an upper surface of each protruding region 150p opposite to the device substrate 110 may be a flat surface. The upper surface of each protruding region 150p may be coplanar with the upper surface of adjacent protruding region 150p. For example, the vertical distance between the device substrate 110 and the upper surface of each protruding region 150p may be the same.

The over-coat layer 150 may further include an over-coat separating hole 152h on the non-display area NEA of the device substrate 110. The over-coat separating hole 152h may expose a portion of the lower passivation layer 140. For example, the over-coat layer 150 on each pixel region R-PA, W-PA, B-PA and G-PA may be separated from the over-coat layer 150 on adjacent pixel region R-PA, W-PA, B-PA and G-PA. The over-coat layer 150 on the red pixel region R-PA may be separated from the over-coat layer 150 on the adjacent white pixel region W-PA. Thus, the display apparatus according to the embodiment of the present invention may prevent damage caused by the external impact or moisture from being transferred to the adjacent pixel region R-PA, W-PA, B-PA and G-PA through the over-coat layer 150.

Light-emitting devices 300R and 300W may be disposed on the protruding regions 150p of the over-coat layer 150. The light-emitting devices 300R and 300W may be disposed in the emission area EA of each pixel region R-PA, W-PA, B-PA and G-PA. For example, the light-emitting device 300R and 300W may include a red light-emitting device 300R on the protruding region 150p of the red pixel region R-PA, a white light-emitting device 300W on the protruding region 150p of the white pixel region W-PA, a blue light-emitting device on the protruding region 150p of the blue pixel region B-PA, and a green light-emitting device on the protruding region 150p of the green pixel region G-PA. The light-emitting devices 300R and 300W may emit light displaying a specific color. For example, each of the light-emitting devices 300R and 300W may include a lower electrode 310R and 310W, a light-emitting layer 320R and 320W, and an upper electrode 330R and 330W, which are sequentially stacked on the upper surface of the corresponding protruding region 150p.

The lower electrode 310R and 310W may be in direct contact with the upper surface of the corresponding protruding region 150p. The lower electrode 310R and 310W may extend along a sidewall of the step compensation groove 150g adjacent to the corresponding protruding region 150p. For example, the lower electrode 310R and 310W may include an end portion at the inside of the step compensation groove 150g which is disposed adjacent to the corresponding protruding region 150p.

The lower electrode 310R and 310W may include a conductive material. The lower electrode 310R and 310W may include a transparent material. For example, the lower electrode 310R and 310W may be a transparent electrode formed of a transparent conductive material, such as ITO and IZO.

The light-emitting layer 320R and 320W may generate light having luminance corresponding to a voltage difference between the lower electrode 310R and 310W and the upper electrode 330R and 330W. For example, the light-emitting layer 320R and 320W may include an emission material layer (EML) having an emission material. The emission material may include an organic material, an inorganic material or a hybrid material. For example, the display apparatus according to the embodiment of the present invention may be an organic light-emitting display apparatus having the light-emitting layer 320R and 320W formed of the organic material.

The light-emitting layer 320R and 320W may have a multi-layer structure in order to increase luminous efficiency. For example, the light-emitting layer 320R and 320W may further include at least one of a hole injection layer (HIL), a hole transporting layer (HTL), an electron transporting layer (ETL) and an electron injection layer (EIL).

The upper electrode 330R and 330W may include a conductive material. The upper electrode 330R and 330W may include a material different from the lower electrode 310R and 310W. For example, the upper electrode 330R and 330W may include a metal having a relatively high reflectivity. Thus, in the display apparatus according to the embodiment of the present invention, the light generated by the light-emitting layer 320R and 320W may be emitted to outside through the lower electrode 310R and 310W, and the device substrate 110.

The light-emitting device 300R and 300W may be controlled by the driving circuit which is disposed in the corresponding pixel region R-PA, W-PA, B-PA and G-PA. For example, the lower electrode 310R and 310W of each light-emitting device 300R and 300W may be electrically connected to the drain electrode 260 of the second thin film transistor T2 in the corresponding pixel region R-PA, W-PA, B-PA and G-PA. The over-coat layer 150 may further include drain contact holes 151h partially exposing the drain electrode 260 of the second thin film transistor T2 in each pixel region R-PA, W-PA, B-PA and G-PA. Each of the drain contact holes 151h may be disposed on the driving area DA of the corresponding pixel region R-PA, W-PA, B-PA and G-PA. For example, the drain contact holes 151h may be disposed in the step compensation groove 150g of the over-coat layer 150. Thus, in the display apparatus according to the embodiment of the present invention, the emission area EA of each pixel region R-PA, W-PA, B-PA and G-PA may be not reduced due to the corresponding drain contact hole 151h. The lower passivation layer 140 may include lower contact holes 140h overlapping with the drain contact holes 151h. For example, the lower electrode 310R and 310W may be in direct contact with the corresponding drain electrode 260 through the drain contact hole 151h and the lower contact hole 140h.

The light-emitting devices 300R and 300W may be driven independently. The lower electrode 310R and 310W of each light-emitting device 300R and 300W may be insulated from the lower electrode 310R and 310W of the adjacent light-emitting device 300R and 300W. For example, the lower electrode 310R of the red light-emitting device 300R may be separated from the lower electrode 310W of the adjacent white light-emitting device 300W. A bank insulating layer 160 may be disposed between the lower electrodes 310R and 310W. For example, the bank insulating layer 160 may cover an edge of each lower electrode 310R and 310W. The light-emitting layer 320R and 320W, and the upper electrode 330R and 330W may be stacked on a portion of the corresponding lower electrode 310R and 310W exposed by the bank insulating layer 160.

The bank insulating layer 160 may include an insulating material. For example, the bank insulating layer 160 may include an organic insulating material. The bank insulating layer 160 may include a material different from the over-coat layer 150.

The bank insulating layer 160 may be disposed in the step compensation groove 150g of the over-coat layer 150. The protruding region 150p of each pixel region R-PA, W-PA, B-PA and G-PA may not overlap with the bank insulating layer 160. For example, the entire portion of the lower electrode 310R and 310W on the protruding region 150p of each pixel region R-PA, W-PA, B-PA and G-PA may be exposed by the bank insulating layer 160. Thus, in the display apparatus according to the embodiment of the present invention, the emission area EA of each pixel region R-PA, W-PA, B-PA and G-PA may be maximized.

An upper surface of the bank insulating layer 160 opposite to the device substrate 110 may be a flat surface. For example, the portion of the lower electrode 310R and 310W exposed by the bank insulating layer 160 may include an upper surface 310RS being coplanar with the upper surface of the bank insulating layer 160. The vertical distance between the device substrate 110 and the upper surface of the bank insulating layer 160 may be the same as the vertical distance between the device substrate 110 and the upper surface 310RS of the lower electrode 310R and 310W which is disposed on the protruding region 150p. Thus, in the display apparatus according to the embodiment of the present invention, the height difference between the bank insulating layer 160 and the protruding region 150p of the over-coat layer 150 may be reduced. Thereby, in the display apparatus according to the embodiment of the present invention, the height difference of the upper electrode 330R and 330W due to the bank insulating layer 160 may be reduced.

The bank insulating layer 160 may include a bank separating hole 160h on the non-display area NEA of the device substrate 110. The bank separating hole 160h may expose a portion of the lower passivation layer 140. For example, the bank insulating layer 160 covering the edge of the lower electrode 310R of the red light-emitting device 300R may be spaced away from the bank insulating layer 160 covering the edge of the lower electrode 310W of the white light-emitting device 300W. Thus, the display apparatus according to the embodiment of the present invention may prevent damage caused by the external impact or moisture from being transferred to the adjacent pixel region R-PA, W-PA, B-PA and G-PA through the bank insulating layer 160.

The bank separating hole 160h may overlap the over-coat separating hole 152h. The size of the bank separating hole 160h may be smaller than the size of the over-coat separating hole 152h. For example, the bank separating hole 160h may be disposed in the over-coat separating hole 152h. A sidewall of the over-coat separating hole 152h may be covered by the bank insulating layer 160. The bank insulating layer 160 may have a water vapor transmission rate lower than the over-coat layer 150. Thus, in the display apparatus according to the embodiment of the present invention, the permeation of the external moisture through the sidewall of the over-coat separating hole 152h may be blocked.

The light-emitting devices 300R and 300W may emit the light displaying the same color. For example, the red light-emitting device 300R, the white light-emitting device 300W, the blue light-emitting device and the green light-emitting device may emit the light displaying white color. The light-emitting layer 320R and 320W of each light-emitting device 300R and 300W may be coupled to the light-emitting layer 320R and 320W of adjacent light-emitting device 300R and 300W. For example, the light-emitting layer 320R and 320W may extend onto the bank insulating layer 160. The light-emitting layer 320R and 320W may be in direct contact with the upper surface 160S of the bank insulating layer 160. For example, a lower surface of the light-emitting layer 320R and 320W toward the device substrate 110 may be a flat surface. The upper electrode 330R and 330W may be extended along the light-emitting layer 320R and 320W. For example, the upper electrode 330R and 330W of each light-emitting device 300R and 300W may be coupled to the upper electrode 330R and 330W of adjacent light-emitting device 300R and 300W. A lower surface of the upper electrode 330R and 330W toward the device substrate 110 may be a flat surface. Thus, in the display apparatus according to the embodiment of the present invention, peeling and/or damage of the upper electrode 330R and 330W due to external force may be prevented.

A sidewall of the bank separating hole 160h may be covered by the upper electrode 330R and 330W. For example, the upper electrode 330R of the red light-emitting device 300R and the upper electrode 330W of the white light-emitting device 300W may extend on a sidewall of the bank separating hole 160h which is disposed between the red pixel region R-PA and the white pixel region W-PA. Thus, in the display apparatus according to the embodiment of the present invention, the permeation of the external moisture through the sidewall of the bank separating hole 160h may be efficiently blocked. And, in the display apparatus according to the embodiment of the present invention, the light emitted from each light-emitting layer 320R and 320W toward adjacent pixel region R-PA, W-PA, B-PA and G-PA may be reflected toward the inside of the corresponding pixel region R-PA, W-PA, B-PA and G-PA by the upper electrode 330R and 330W covering the sidewall of the separating hole 160h. Thereby, in the display apparatus according to the embodiment of the present invention, the light extraction efficiency may be improved.

The red pixel region R-PA, the blue pixel region B-PA and the green pixel region G-PA may include a color filter 400R, 400B and 400G. For example, the light emitted from the red light-emitting device 300R, the blue light-emitting device and the green light-emitting device may be emitted outside passing through the corresponding color filter 400R, 400B and 400G. The color filter 400R, 400B and 400G may be disposed between the lower passivation layer 140 and the over-coat layer 150. The thickness difference due to the color filter 400R, 400B and 400G may be removed by the over-coat layer 150.

The color filter 400R, 400B and 400G may overlap the protruding region 150p of each pixel region R-PA, W-PA, B-PA and G-PA. The horizontal distance of the color filter 400R, 400B and 400G may be larger than the horizontal distance of the corresponding protruding region 150p. Thus, the display apparatus according to the embodiment of the present invention may prevent the light emitted by each light-emitting device 300R and 300W from being emitted without passing through the corresponding color filter 400R, 400B and 400G. Thereby, in the display apparatus according to the embodiment of the present invention, the light leakage may be prevented.

An upper passivation layer 170 may be disposed on the light-emitting devices 300R and 300W. The upper passivation layer 170 may prevent the damage of the light-emitting devices 300R and 300W due to the external impact and moisture. The upper passivation layer 170 may extend along the upper electrode 330R and 330W. The upper passivation layer 170 may have a multi-layer structure. For example, the upper passivation layer 170 may have a structure in which an organic insulating layer formed of an organic material is disposed between inorganic insulating layers formed of an inorganic material.

An encapsulating layer 180 may be disposed on the upper passivation layer 170. The encapsulating layer 180 may prevent the damage of the light-emitting devices 300R and 300W due to the external impact and moisture. The encapsulating layer 180 may have a multi-layer structure. For example, the encapsulating layer 180 may include a lower encapsulating layer 181 on the upper passivation layer 170, and an upper encapsulating layer 182 on the lower encapsulating layer 181. Moisture-absorbing particles 182p having a moisture-absorbing material may be dispersed in the upper encapsulating layer 182. In the display apparatus according to the embodiment of the present invention, the stress applied to the light-emitting element 300R and 300W due to the expansion of the moisture-absorbing particles 182p may be relieved by the lower encapsulating layer 181.

The lower encapsulating layer 181 and the upper encapsulating layer 182 may include an insulating material. The lower encapsulating layer 181 and the upper encapsulating layer 182 may include a material that does not require a curing process. For example, the lower encapsulating layer 181 and the upper encapsulating layer 182 may include an olefin based material. Thus, in the display apparatus according to the embodiment of the present invention, the deterioration of the light-emitting devices 300R and 300W due to a process of forming the encapsulating layer 180 may be prevented. The lower encapsulating layer 181 may include a material different from the upper encapsulating layer 182.

An encapsulation substrate 190 may be disposed on the encapsulating layer 180. The encapsulation substrate 190 may be coupled to the device substrate 110 in which the light-emitting devices 300R and 300W, by the encapsulating layer 180. The encapsulation substrate 190 may include a material different from the device substrate 110. For example, the encapsulation substrate 190 may include a material having a specific hardness. Thus, in the display apparatus according to the embodiment of the present invention, the damage of the light-emitting devices 300R and 300W due to the external impact may be prevented.

The encapsulation substrate 190 may provide a path for radiating heat which is generated by the light-emitting devices 300R and 300W and/or the driving circuits in each pixel region R-PA, W-PA, B-PA and G-PA in the operation of realizing an image. For example, the encapsulation substrate 190 may include a metal having a relatively high thermal conductivity, such as aluminum (Al), nickel (Ni) and iron (Fe). Thus, in the display apparatus according to the embodiment of the present invention, the deterioration of the light-emitting devices 300R and 300W due to the heat generated by the light-emitting devices 300R and 300W and/or the driving circuits may be prevented.

Accordingly, the display apparatus according to the embodiment of the present invention may include the over-coat layer 150 having the step compensation groove 150g between the device substrate 110 and the light-emitting devices 300R and 300W, and a bank insulating layer 160 in the step compensation groove 150g, an upper surface 160S of the bank insulating layer 160 toward the light-emitting layer 320R and 320W being a flat surface. Thus, in the display apparatus according to the embodiment of the present invention, the height difference of the upper electrode 330R and 330W due to the bank insulating layer 160 may be minimized. Thereby, in the display apparatus according to the embodiment of the present invention, peeling and/or damage of the upper electrode 330R and 330W due to the height difference and/or the external force may be prevented.

The display apparatus according to the embodiment of the present invention is described that the over-coat layer 150 includes a protruding region 150p in each pixel region R-PA, W-PA, B-PA and G-PA, and a step compensation groove 150g disposed outside the protruding region 150p. However, the display apparatus according to another embodiment of the present invention, the step compensation groove 150g of the over-coat layer 150 may be a closed loop shape extending along an edge of the corresponding lower electrode 310R and 310W in each pixel region R-PA, W-PA, B-PA and G-PA. Thus, in the display apparatus according to the embodiment of the present invention, the height difference due to the driving circuits may be sufficiently reduced enough, and the height difference of the upper electrode 330R and 330W due to the bank insulating layer 160 may be minimized.

Figure 3A:
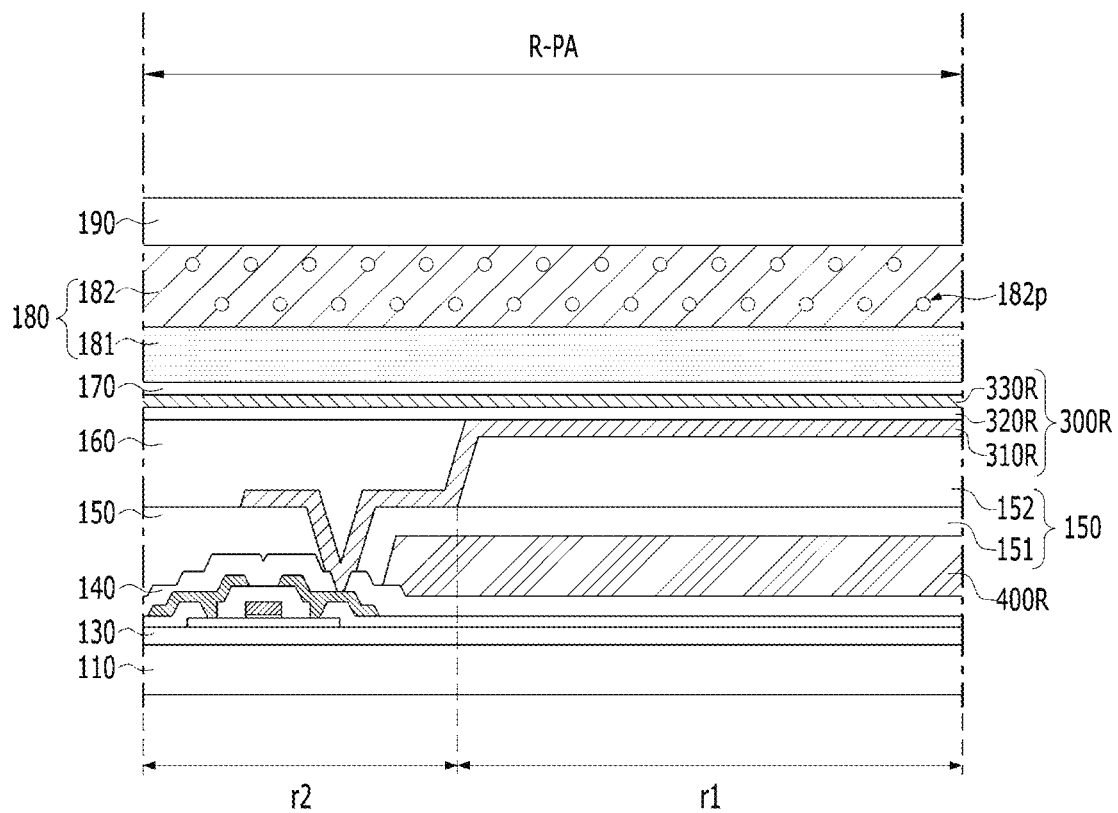
FIGS. 3A and 3B are views showing a display apparatus according to another embodiment of the present invention.
Figure 3B:
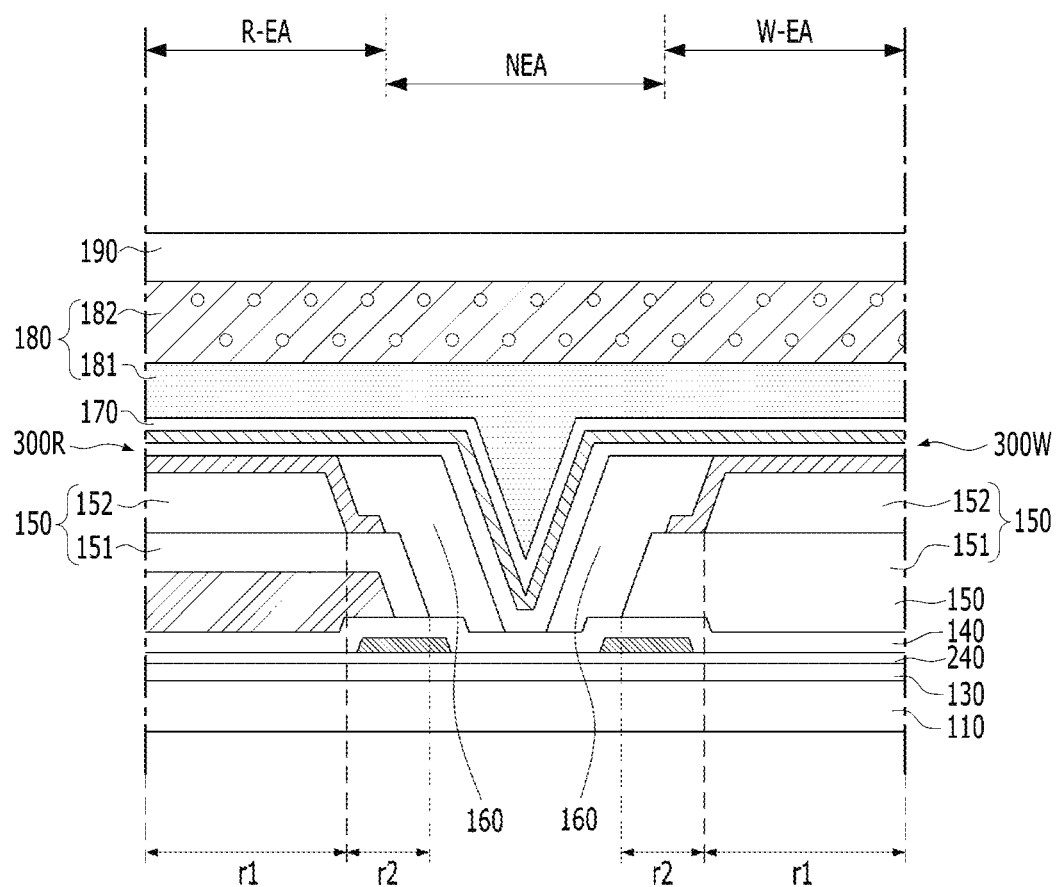

The display apparatus according to the embodiment of the present invention is described that the over-coat layer 150 having a single-layer structure includes the step compensation groove 150g for the bank insulating layer 160. However, in the display apparatus according to another embodiment of the present invention, the over-coat layer 150 may include layers with different size, which are stacked on the lower passivation layer 140 for reducing the height difference of the upper electrode 330R and 330W due to the bank insulating layer 160. For example, in the display apparatus according to another embodiment of the present invention, the over-coat layer 150 may include a first over-coat layer 151 having a first region r1 and a second region r2, and a second over-coat layer 152 on the first region r1 of the first over-coat layer 151, as shown in FIGS. 3A and 3B. The second region r2 may be disposed outside the first region r1. The second over-coat layer 152 may expose the second region r2 of the first over-coat layer 151. The bank insulating layer 160 may be disposed on the second region r2 of the first over-coat layer 151. The lower electrode 310R and 310W of each pixel region R-EA and W-EA may be disposed on the first region r1 of the first over-coat layer 151.

Each of the lower electrodes 310R and 310W may extend between the second region r2 of the first over-coat layer 151 and the bank insulating layer 160. The vertical distance between the second region r2 of the first over-coat layer 151 and the light-emitting layer 320R and 320W may be the same value as a sum of the thickness of the second over-coat layer 152 and the thickness of the corresponding lower electrode 310R and 310W. The second over-coat layer 152 may include a material different from the first over-coat layer 151. Thus, in the display apparatus according to another embodiment of the present invention, the height difference of the upper electrode 330R and 330W due to deviation of the etching process may be minimized. Thereby, in the display apparatus according to another embodiment of the present invention, peeling and/or damage of the upper electrode 310R and 310W may be efficiently prevented.

Figure 4:
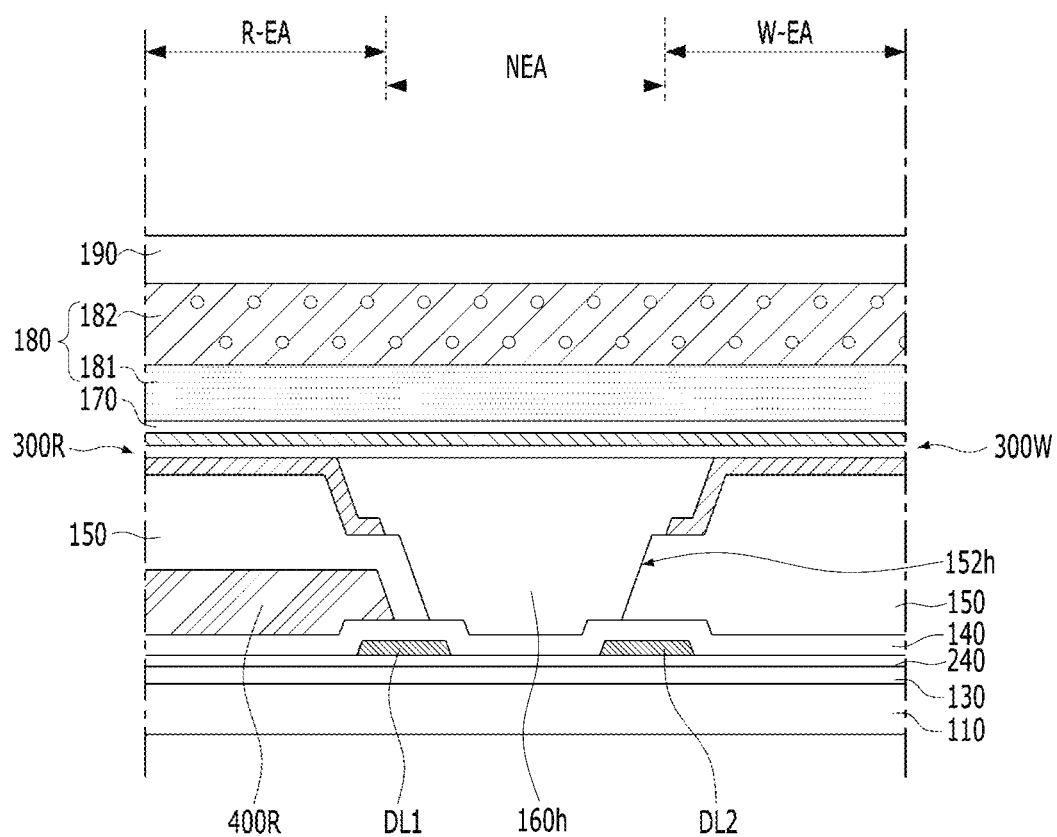
FIG. 4 is a view showing a display apparatus according to further another embodiment of the present invention.

The display apparatus according to the embodiment of the present invention is described that the bank insulating layer 160 includes the bank separating hole 160h on the non-display area NEA of the device substrate 110. However, in the display apparatus according to another embodiment of the present invention, a space between adjacent pixel regions R-PA and W-PA may be completely filled by the bank insulating layer 160, as shown in FIG. 4. Thus, in the display apparatus according to another embodiment of the present invention, the light-emitting devices 300R and 300W on adjacent pixel regions R-PA, W-PA, B-PA and G-PA may be sufficiently insulated.

FIGS. 5A to 11A and 5B to 11B are views sequentially showing a method of forming the display apparatus according to an embodiment of the present invention. FIG. 10C is an enlarged view of K region in FIG. 10A.

Figure 5A:
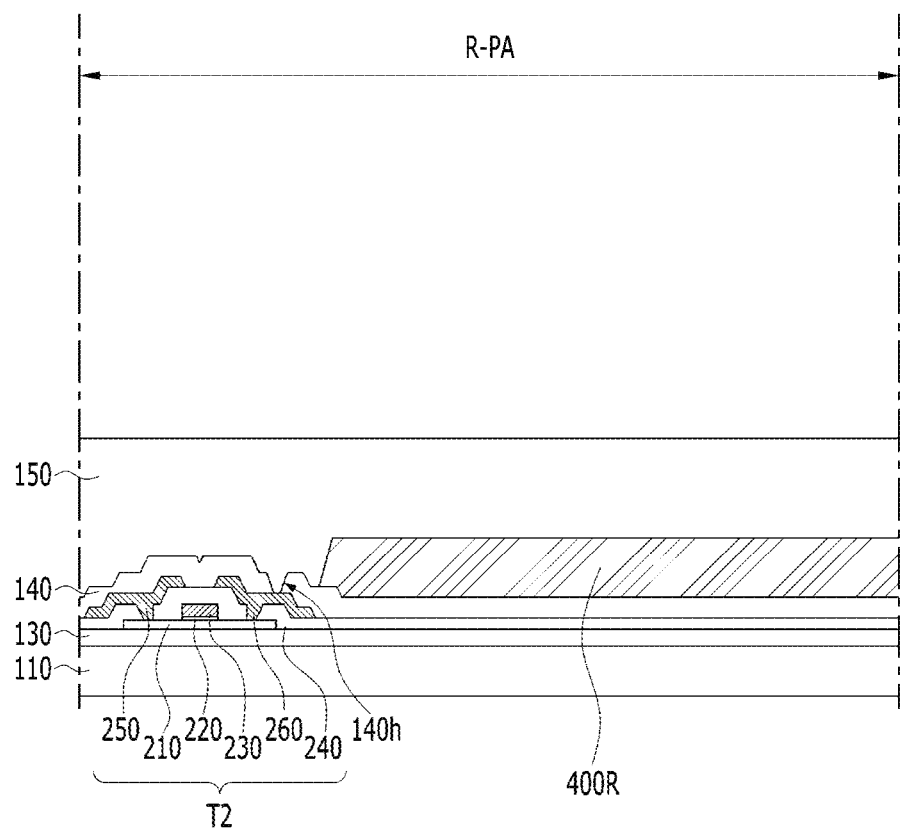
FIGS. 5A to 10B and 11A to 11B are views sequentially showing a method of forming the display apparatus according to an embodiment of the present invention.
Figure 5B:
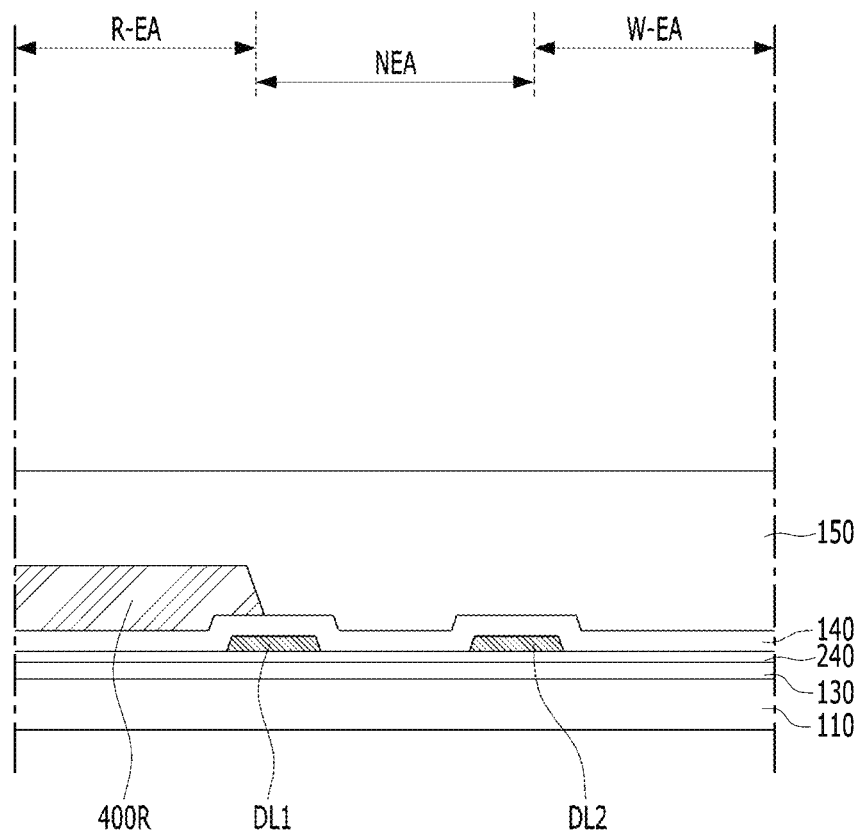

A method of forming the display device according to the embodiment of the present invention will be described with reference to FIGS. 2A, 2B, 5A to 11B. First, as shown in FIGS. 5A and 5B, the method of forming the display apparatus according to the embodiment of the present invention may include a step of forming a buffer layer 130 on a device substrate 110, a step of forming signal lines including data line DL1 and DL2 on the buffer layer 130, a step of forming a driving circuit having a second thin film transistor T2 electrically connected to the signal lines, a step of forming a lower passivation layer 140 on the entire surface of the device substrate 110 in which the driving circuit is formed, a step of forming a color filter 400R on the lower passivation layer 140, and a step of forming an over-coat layer 150 covering the color filter 400R.

The second thin film transistor T2 may include a semiconductor pattern 210, a gate insulating layer 220, a gate electrode 230, an interlayer insulating layer 240, a source electrode 250 and a drain electrode 260. The step of forming the lower passivation layer 140 may include a step of forming a lower contact hole 140h exposing a portion of the drain electrode 260 in the lower passivation layer 140.

The step of forming the over-coat layer 150 may include a step of removing a thickness difference due to the driving circuit and the signal lines. For example, an upper surface of the over-coat layer 150 opposite to the device substrate 110 may be a flat surface.

Figure 6A:
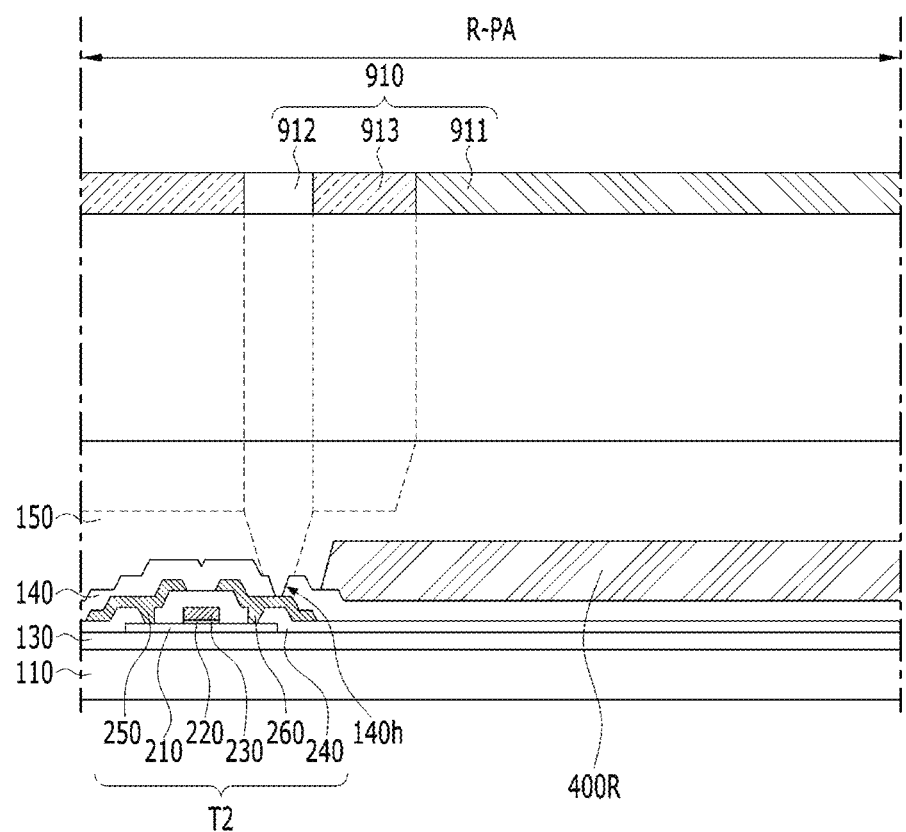
Figure 6B:
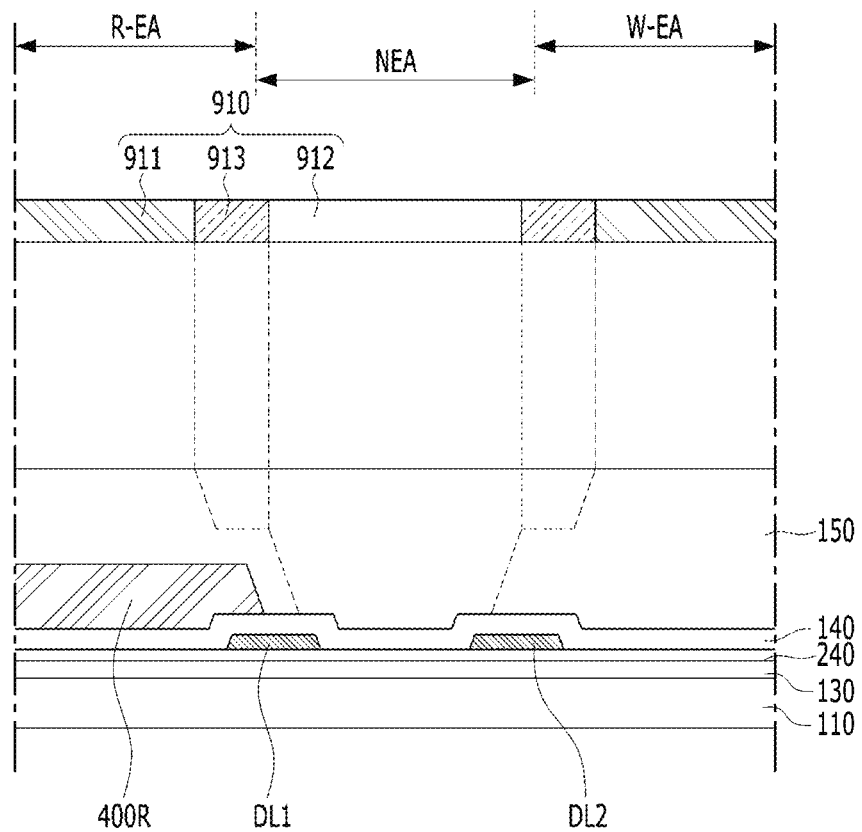

As shown in FIGS. 6A and 6B, the method of forming the display apparatus according to the embodiment of the present invention may include a step of locating a half-tone mask 910 on the over-coat layer 150.

The half-tone mask 910 may include a first blocking region 911, a first transmitting region 912 and a half-transmitting region 913. The first blocking region 911 may block light. The first transmitting region 912 may transmit the light. For example, the first transmitting region 912 may overlap a region where a drain contact hole and an over-coat separating hole are to be formed by a subsequent process. The half-transmitting region 913 may block some of the light. For example, the half-transmitting region 913 may overlap a region where a step compensation groove is to be formed by a subsequent process.

Figure 7A:
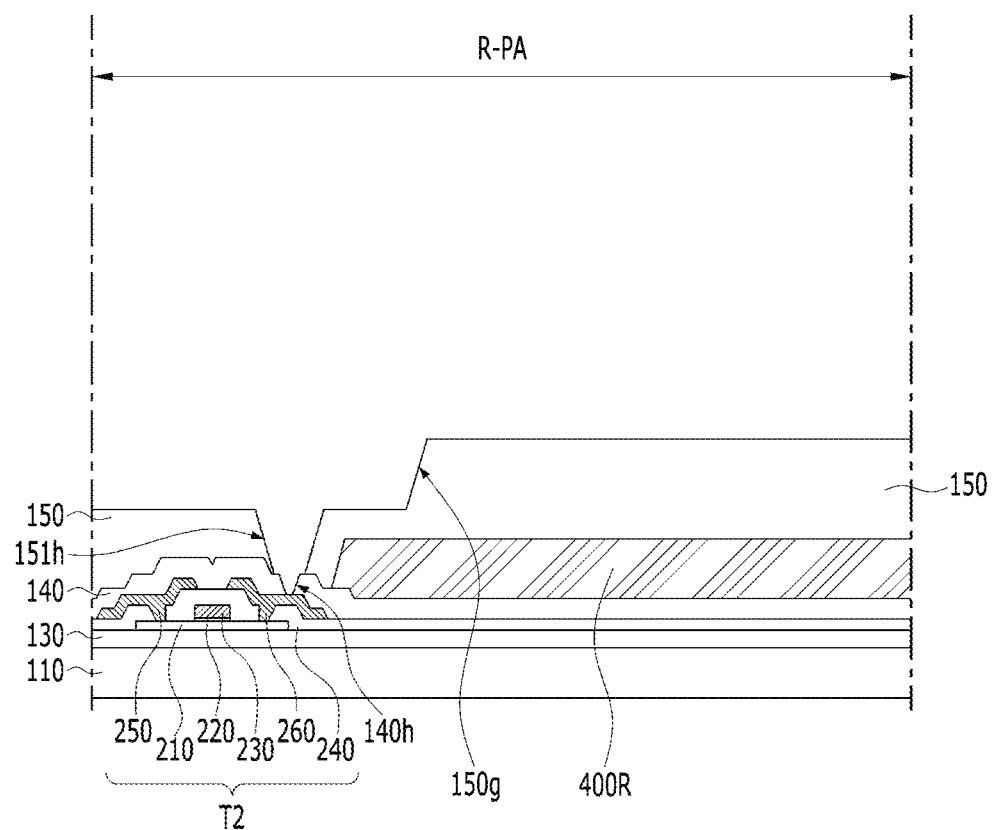
Figure 7B:
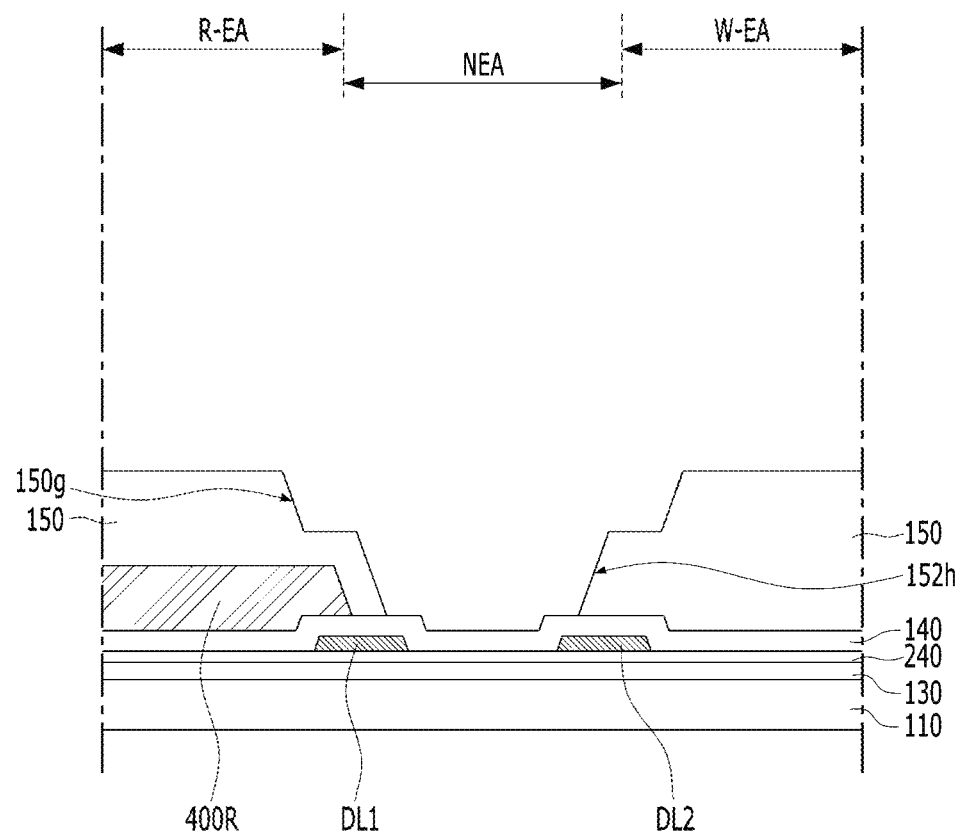

As shown in FIGS. 7A and 7B, the method of forming the display apparatus according to the embodiment of the present invention may include a step of forming the step compensation groove 150g, the drain contact hole 151h and the over-coat separating hole 152h in the over-coat layer 150 using the half-tone mask 910.

The drain contact hole 151h may partially expose the drain electrode 260 of the second thin film transistor T2. For example, the drain contact hole 151h may overlap with the lower contact hole 140h. The over-coat separating hole 152h may be formed on a non-display area NEA between the adjacent pixel regions R-PA and W-PA.

The step of forming the step compensation groove 150g, the drain contact hole 151h and the over-coat separating hole 152h may include a step of exposing and developing the over-coat layer 150 using the half-tone mask 910. Thus, in the method of forming the display apparatus according to the embodiment of the present invention, the step compensation groove 150g, the drain contact hole 151h and the over-coat separating hole 152h may be simultaneously formed. Thereby, in the method of forming the display apparatus according to the embodiment of the present invention, increasing the number of the mask due to forming the step compensation groove 150g may be prevented.

Figure 8A:
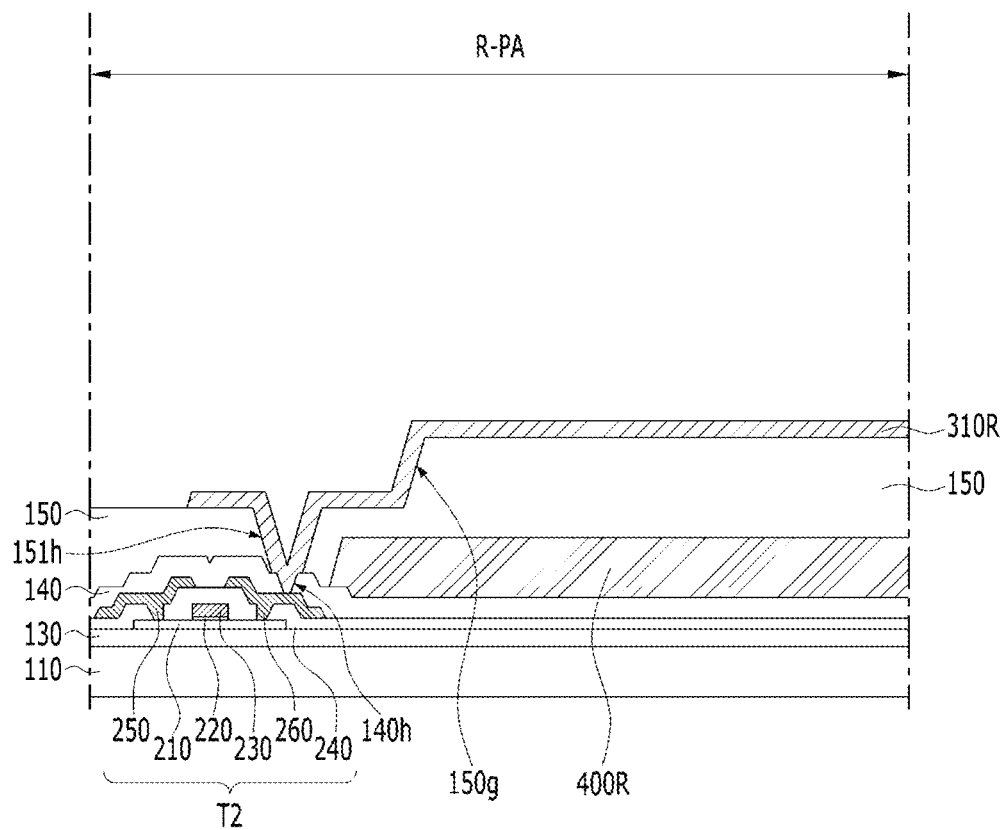
Figure 8B:
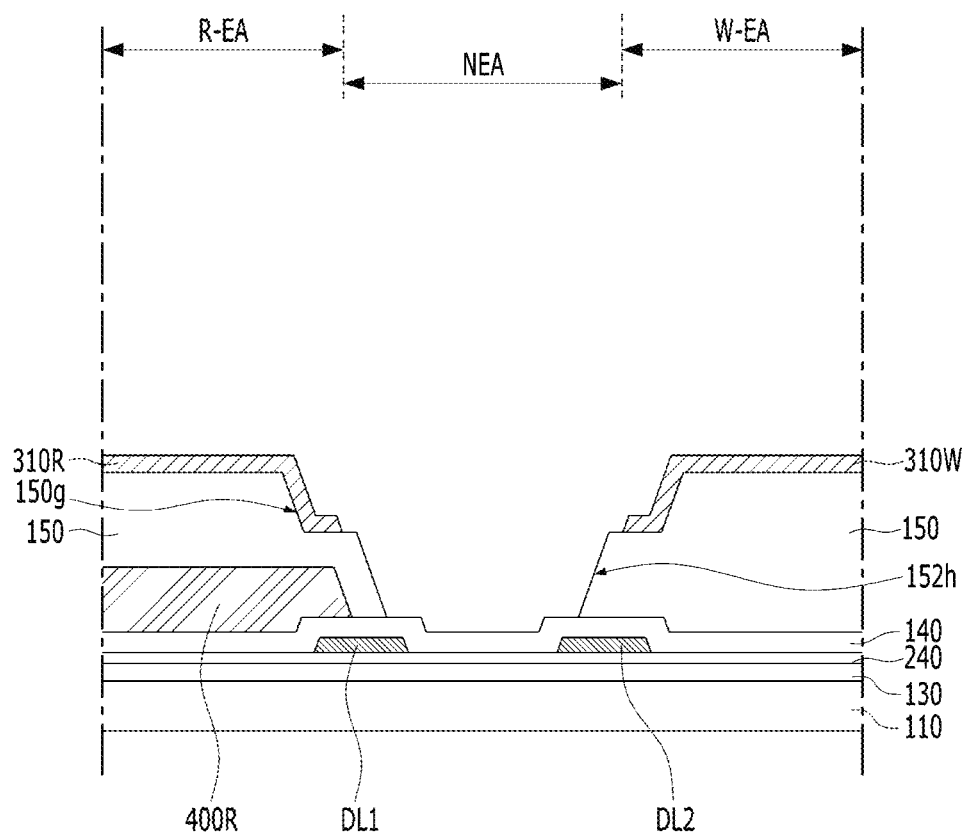

As shown in FIGS. 8A and 8B, the method of forming the display apparatus according to the embodiment of the present invention may include a step of forming lower electrode 310R and 310W on an upper surface of the over-coat layer 150 including the drain contact hole 151h and the step compensation groove 150g.

The step of forming the lower electrodes 310R and 310W may include a step of forming a conductive material layer on the upper surface of the over-coat layer 150, and a step of patterning the conductive material layer. The lower electrodes 310R and 310W may be spaced away from each other. For example, each of the lower electrodes 310R and 310W may include an end portion in the step compensation groove 150g of the over-coat layer 150.

Figure 9A:
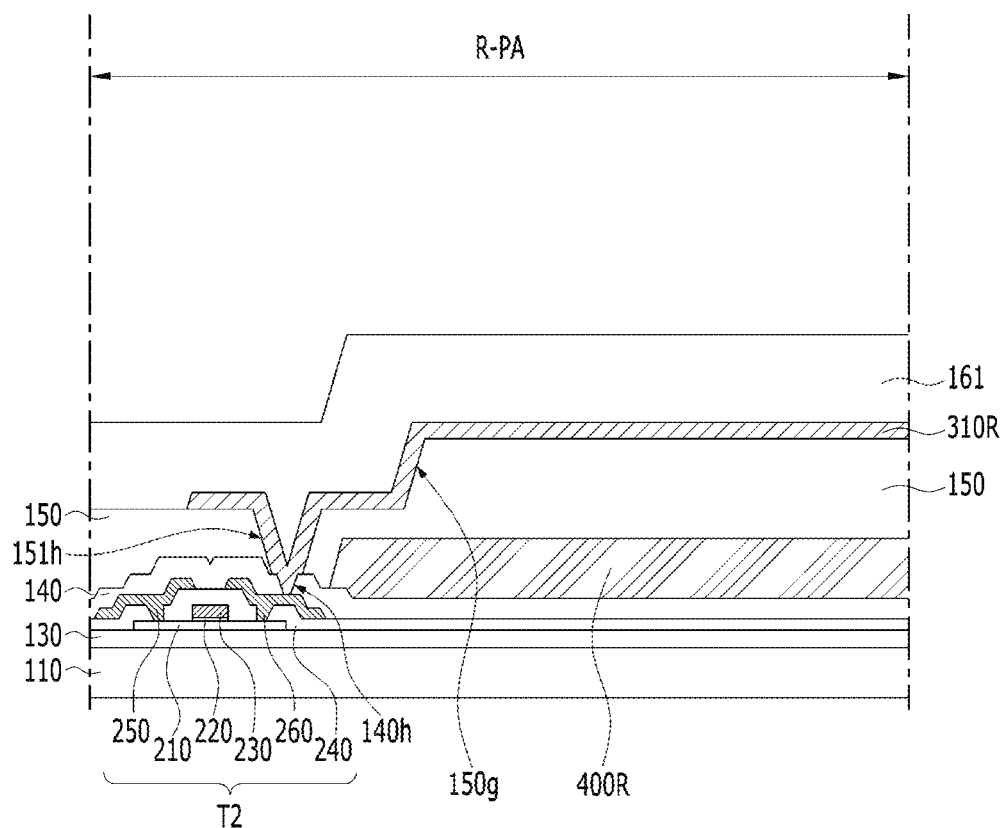
Figure 9B:
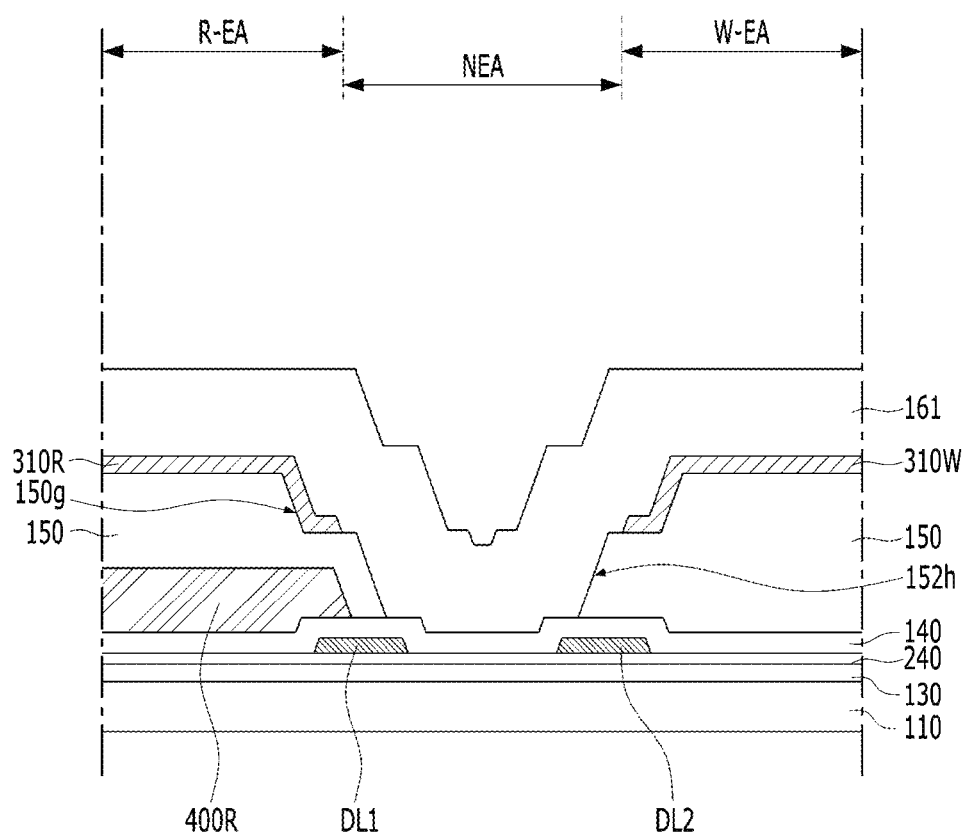

As shown in FIGS. 9A and 9B, the method of forming the display apparatus according to the embodiment of the present invention may include a step of forming an insulating material layer 161 on the entire surface of the device substrate 110 in which the lower electrodes 310R and 310W are formed.

The insulating material layer 161 may be formed of an insulating material. For example, the insulating material layer 161 may be formed of an organic insulating material. The insulating material layer 161 may have a water vapor transmission rate lower than the over-coat layer 150. The insulating material layer 161 may be formed to a specific thickness.

Figure 10A:
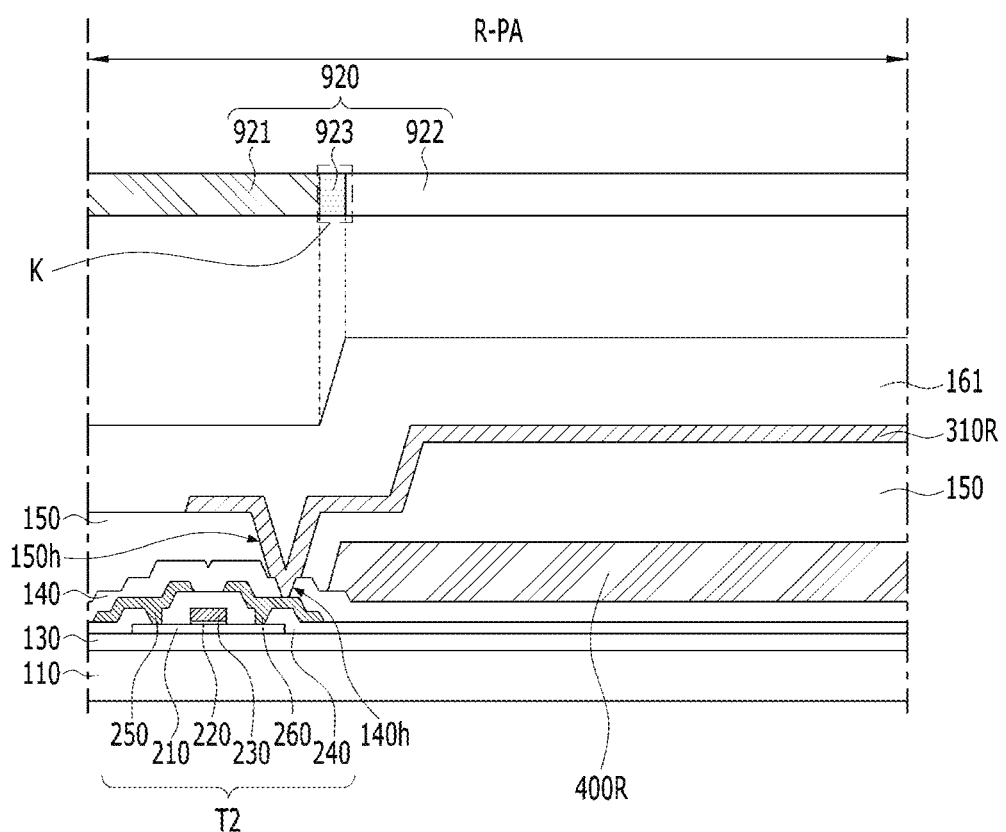
FIG. 10C is an enlarged view of K region in FIG. 10A.
Figure 10B:
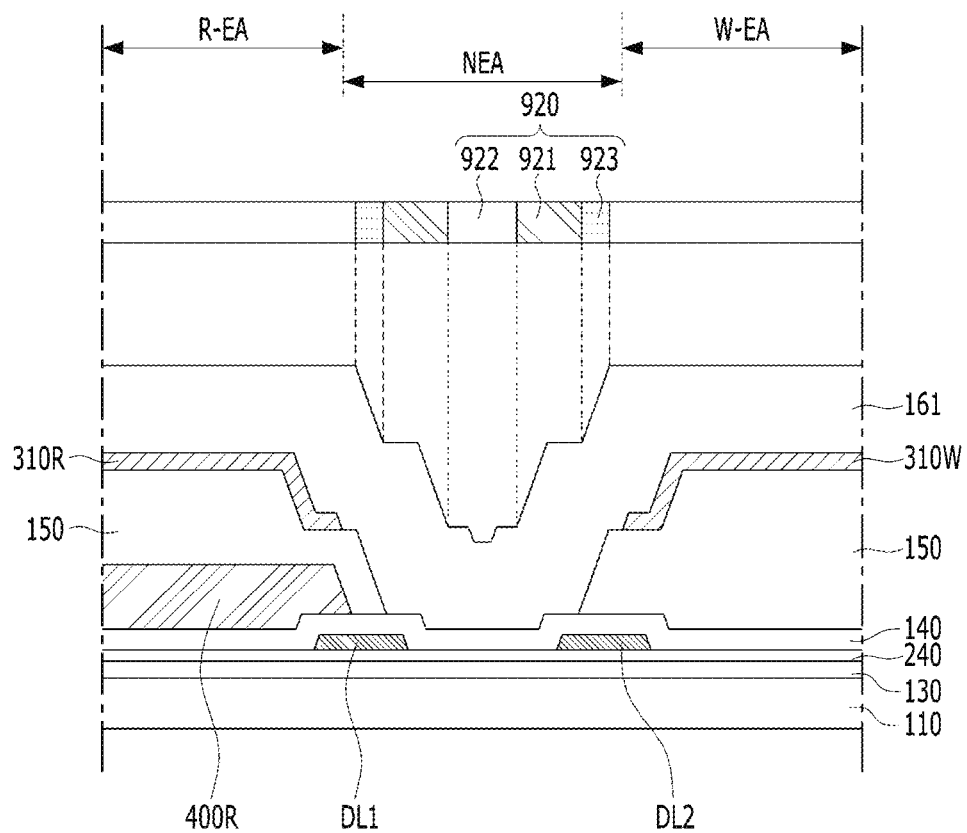
Figure 10C:
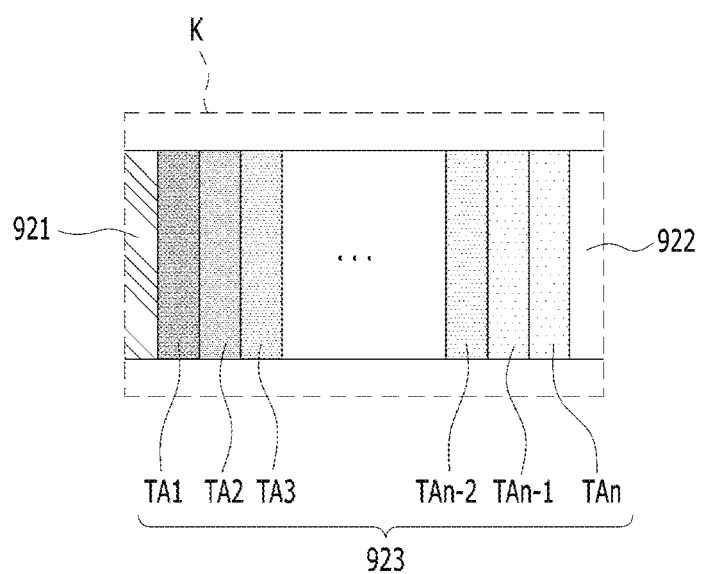

As shown in FIGS. 10A to 10C, the method of forming the display apparatus according to the embodiment of the present invention may include a step of locating a multi-tone mask 920 on the insulating material layer 161.

The multi-tone mask 920 may include a second blocking region 921, a second transmitting region 922 and a multi-tone region 923. The second blocking region 921 and the multi-tone region 923 may overlap a region where a bank insulating layer is to be formed by a subsequent process.

In the multi-tone region 923, a plurality of regions TA1-TAn having different transmittances may be sequentially disposed. For example, a flat region overlapping with the multi-tone region 923 may become an inclined surface by exposing and developing. An inclined surface overlapping with the multi-tone region 923 may become a flat surface by exposing and developing. For example, the change in transmittance of the multi-tone region 923 may be proportional to the inclination angle of the inclined surface.

Figure 11A:
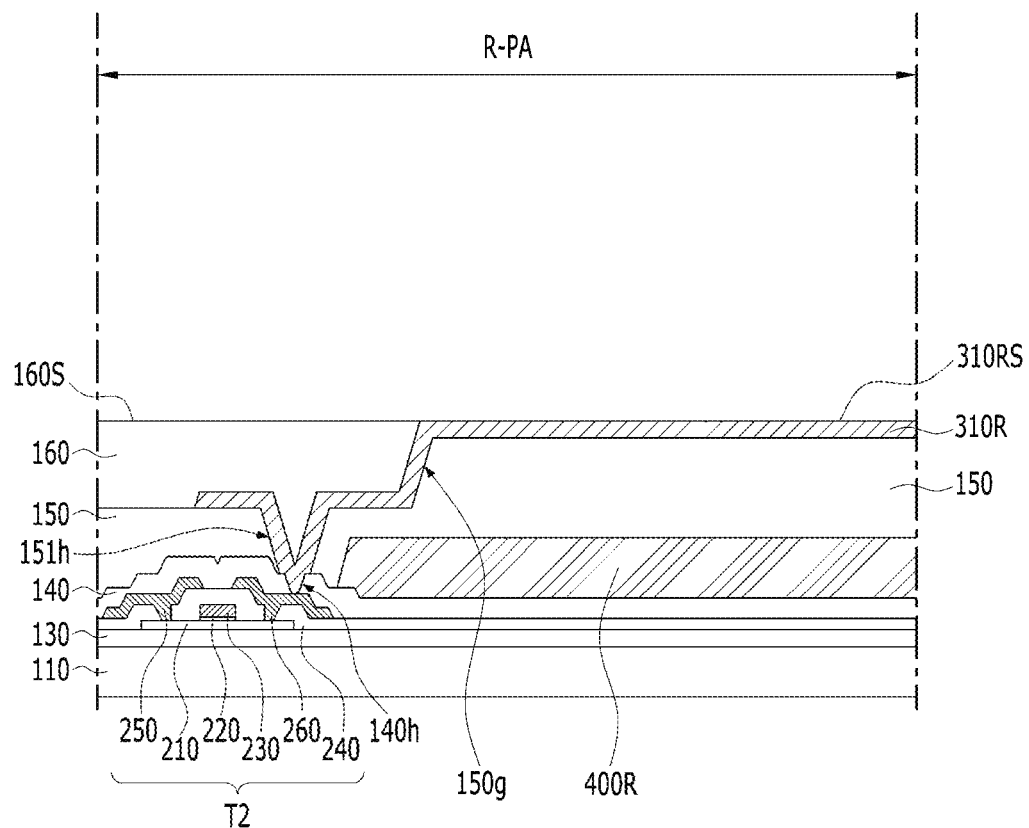
Figure 11B:
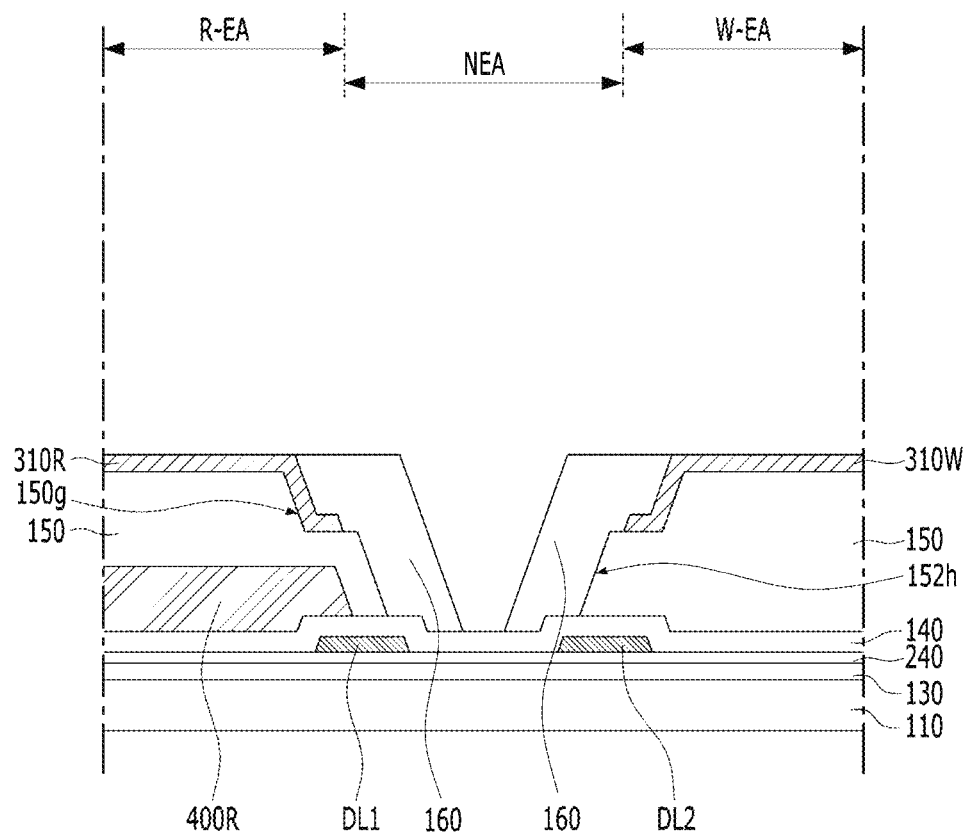

As shown in FIGS. 11A and 11B, the method of forming the display apparatus according to the embodiment of the present invention may include a step of forming the bank insulating layer 160 using the multi-tone mask 920.

The step of forming the bank insulating layer 160 may include a step of exposing and developing the insulating material layer 161 using the multi-tone mask 920. The step of forming the bank insulating layer 160 may include a step of planarizing an upper surface of the bank insulating layer 160. For example, the multi-tone region 923 of the multi-tone mask 920 may overlap the inclined surface of the insulating material layer 161. The change in transmittance of the multi-tone region 923 may be proportional to the inclination angle of the inclined surface of the insulating material layer 161. Thus, in the method of forming the display apparatus according to the embodiment of the present invention, the upper surface of the bank insulating layer 160 opposite to the device substrate 110 may become a flat surface due to exposing and developing by using the multi-tone mask 920. Thereby, in the method of forming the display apparatus according to the embodiment of the present invention, the upper surface of the bank insulating layer 160 may be planarized without adding a mask and/or a process.

The step of planarizing the upper surface of the bank insulating layer 160 may include a step of forming the upper surface of the bank insulating layer 160 to be coplanar with an upper surface of the lower electrodes 310R and 310W opposite to the device substrate 110. Thus, in the method of forming the display apparatus according to the embodiment of the present invention, a height difference of an upper electrode which is formed by a subsequent process may be reduced.

As shown in FIGS. 2A and 2B, the method of forming the display apparatus according to the embodiment of the present invention may include a step of stacking a light-emitting layer 320R and 320W and the upper electrode 330R and 330W on the lower electrodes 310R and 310W, and the bank insulating layer 160, a step of forming an upper passivation layer 170 on the upper electrode 330R and 330W, and a step of attaching an encapsulation substrate 190 using an encapsulating layer 180.

Accordingly, in the method of forming the display apparatus according to the embodiment of the present invention, the step compensation groove 150g may be formed in the over-coat layer 150, the bank insulating layer 160 covering the edge of the lower electrode 310R and 310W may be formed in the step compensation groove 150g, and the upper surface of the bank insulating layer 160 may be formed in a flat surface. Thus, in the method of forming the display apparatus according to the embodiment of the present invention, the height difference of the upper electrode 330R and 330W may be minimized. And, in the method of forming the display apparatus according to the embodiment of the present invention, the height difference of the upper electrode 330R and 330W may be reduced without adding a mask and a process due to the half-tone mask 910 and the multi-tone mask 920. Thereby, in the method of forming the display apparatus according to the embodiment of the present invention, the life-time and the reliability of a light-emitting device 300R and 300W may be improved without decreasing the process efficiency.

In the result, the display apparatus according to the embodiments of the present invention and the method of forming the same may include an over-coat layer in which a step compensation groove is formed, and a bank insulating layer covering an edge of a lower electrode in the step compensation groove, an upper surface of the bank insulating layer being formed in a flat surface. Thus, in the display apparatus according to the embodiments of the present invention and the method of forming the same, the height difference of the upper electrode may be minimized, and peeling and/or damage of the upper electrode may be prevented. Therefore, in the display apparatus according to the embodiments of the present invention and the method of forming the same, the life-time and the reliability of a light-emitting device may be improved.

It will be apparent to those skilled in the art that various modifications and variations can be made in the display apparatus having a light-emitting device on an over-coat layer and method of forming the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus, comprising:
an over-coat layer on a device substrate, the over-coat layer including a step compensation groove;
a first lower electrode on the over-coat layer, the first lower electrode including an end portion in the step compensation groove;
a bank insulating layer in the step compensation groove of the over-coat layer, the bank insulating layer covering the end portion of the first lower electrode;
a light-emitting layer on a portion of the first lower electrode exposed by the bank insulating layer; and
an upper electrode on the light-emitting layer,
wherein an upper surface of the bank insulating layer toward the light-emitting layer is a flat surface.

2. The display apparatus according to claim 1, wherein the upper surface of the bank insulating layer is coplanar with an upper surface of the first lower electrode toward the light-emitting layer.

3. The display apparatus according to claim 1, wherein the step compensation groove of the over-coat layer extends along an edge of the first lower electrode.

4. The display apparatus according to claim 1, further comprising a thin film transistor between the device substrate and the over-coat layer,
wherein the over-coat layer includes a drain contact hole partially exposing a drain electrode of the thin film transistor, and
wherein the drain contact hole is disposed in the step compensation groove.

5. The display apparatus according to claim 1, further comprising a second lower electrode on the over-coat layer,
wherein the second lower electrode is spaced away from the first lower electrode, and
wherein the bank insulating layer includes a bank separating hole between the first lower electrode and the second lower electrode.

6. The display apparatus according to claim 5, wherein the upper electrode extends onto a sidewall of the bank separating hole.

7. The display apparatus according to claim 5, wherein the over-coat layer further includes an over-coat separating hole overlapping with the bank separating hole.

8. The display apparatus according to claim 7, wherein the bank insulating layer has a water vapor transmission rate lower than the over-coat layer, and
wherein a sidewall of the over-coat separating hole is covered by the bank insulating layer.

9. A display apparatus, comprising:
a first over-coat layer on a device substrate, the first over-coat layer including:
a first region; and
a second region disposed at the outside of the first region;
a second over-coat layer on the first region of the first over-coat layer;
a light-emitting layer on the second over-coat layer, the light-emitting layer extending onto the second region of the first over-coat layer;
a bank insulating layer between the second region of the first over-coat layer and the light-emitting layer;
a lower electrode between the second over-coat layer and the light-emitting layer, the lower electrode extending between the first over-coat layer and the bank insulating layer; and
an upper electrode on the light-emitting layer,
wherein the second over-coat layer and the bank insulating layer are disposed side by side on the first over-coat layer, and
wherein a lower surface of the light-emitting layer toward the device substrate is a flat surface on the second over-coat and the bank insulating layer.

10. The display apparatus according to claim 9, wherein the vertical distance between the second region of the first over-coat layer and the light-emitting layer is the same as a sum of the thickness of the second over-coat layer and the thickness of the lower electrode.

11. The display apparatus according to claim 9, further comprising:
a color filter between the device substrate and the first over-coat layer,
wherein the color filter overlaps with the second over-coat layer.

12. The display apparatus according to claim 11, wherein the horizontal width of the color filter is larger than the horizontal width of the second over-coat layer.

13. The display apparatus according to claim 9, wherein the second over-coat layer includes a material different from the first over-coat layer.

14. The display apparatus according to claim 9, further comprising:
an encapsulating layer on the upper electrode; and
an encapsulation substrate on the encapsulating layer,
wherein the thermal conductivity of the encapsulation substrate is higher than the thermal conductivity of the device substrate.

15. A method of forming a display apparatus, comprising:
a step of forming an over-coat layer on a device substrate, the over-coat layer including a step compensation groove;
a step of forming a lower electrode on the over-coat layer, the lower electrode extending along a sidewall of the step compensation groove;

a step of forming an insulating material layer on an entire surface of the device substrate in which the lower electrode is formed;

a step of forming a bank insulating layer covering an end portion of the lower electrode in the step compensation groove by selectively etching the insulating material layer;

a step of forming a light-emitting layer on a portion of the lower electrode exposed by the bank insulating layer; and a step of forming an upper electrode on the light-emitting layer, wherein the step of forming the bank insulating layer includes a step of planarizing an upper surface of the bank insulating layer opposite to the device substrate.

16. The method according to claim 15, wherein the step of planarizing the upper surface of the bank insulating layer includes a step of forming the upper surface of the bank insulating layer to be coplanar with an upper surface of the lower electrode opposite to the device substrate.

17. The method according to claim 15, wherein the step of forming the bank insulating layer includes a step of locating a mask on the insulating material layer, and a step of exposing the insulating material layer using the mask, wherein the mask includes a blocking region, a transmitting region and a multi-tone region between the blocking region and the transmitting region, wherein the multi-tone region of the mask overlaps with an inclined surface of the insulating material layer, and wherein the transmittance of the multi-tone region changes sequentially from the blocking region toward the transmitting region.

18. The method according to claim 17, wherein the blocking region overlaps with a bottom surface of the step compensation groove, and wherein the change in transmittance of the multi-tone region is proportional to the inclination angle of the inclined surface of the insulating material layer.

19. The method according to claim 15, further comprising a step of forming a thin film transistor between the device substrate and the over-coat layer, wherein the step of forming the over-coat layer includes a step of forming a drain contact hole partially exposing a drain electrode of the thin film transistor in the step compensation groove.

20. The method according to claim 19, wherein the drain contact hole is formed simultaneously with the step compensation groove.

* * * * *